(12) United States Patent
Fuller et al.

(10) Patent No.: US 8,652,969 B2
(45) Date of Patent: Feb. 18, 2014

(54) HIGH ASPECT RATIO AND REDUCED UNDERCUT TRENCH ETCH PROCESS FOR A SEMICONDUCTOR SUBSTRATE

(75) Inventors: Nicholas C. M. Fuller, North Hills, NY (US); Eric A. Joseph, White Plains, NY (US); Edmund M. Sikorski, Florida, NY (US); Goh Matsuura, Hartsdale, NY (US)

(73) Assignees: International Business Machines Corporation, Armonk, NY (US); ZEON Corporation, Tokyo (JP)

( * ) Notice: Subject to any disclaimer, the term of this patent is extended or adjusted under 35 U.S.C. 154(b) by 28 days.

(21) Appl. No.: 13/281,715

(22) Filed: Oct. 26, 2011

(65) Prior Publication Data

US 2013/0105947 A1 May 2, 2013

(51) Int. Cl.
*H01L 21/768* (2006.01)
*H01L 23/00* (2006.01)

(52) U.S. Cl.
USPC .......................................................... 438/703

(58) Field of Classification Search
USPC .......................................................... 438/703
See application file for complete search history.

(56) References Cited

U.S. PATENT DOCUMENTS

| | | | |
|---|---|---|---|
| 6,284,148 B1 * | 9/2001 | Laermer et al. | 216/37 |
| 7,141,504 B1 * | 11/2006 | Bhardwaj | 438/700 |
| 2004/0072443 A1 * | 4/2004 | Huang et al. | 438/710 |
| 2009/0280643 A1 * | 11/2009 | Andry et al. | 438/656 |

* cited by examiner

*Primary Examiner* — Matthew W Such
*Assistant Examiner* — Robert Carpenter
(74) *Attorney, Agent, or Firm* — Scully, Scott, Murphy & Presser, P.C.; Louis J. Percello, Esq.

(57) ABSTRACT

A hydrofluorocarbon gas is employed as a polymer deposition gas in an anisotropic etch process employing an alternation of an etchant gas and the polymer deposition gas to etch a deep trench in a semiconductor substrate. The hydrofluorocarbon gas can generate a thick carbon-rich and hydrogen-containing polymer on sidewalls of a trench at a thickness on par with the thickness of the polymer on a top surface of the semiconductor substrate. The thick carbon-rich and hydrogen-containing polymer protects sidewalls of a trench, thereby minimizing an undercut below a hard mask without degradation of the overall rate. In some embodiments, an improvement in the overall etch rate can be achieved.

25 Claims, 22 Drawing Sheets

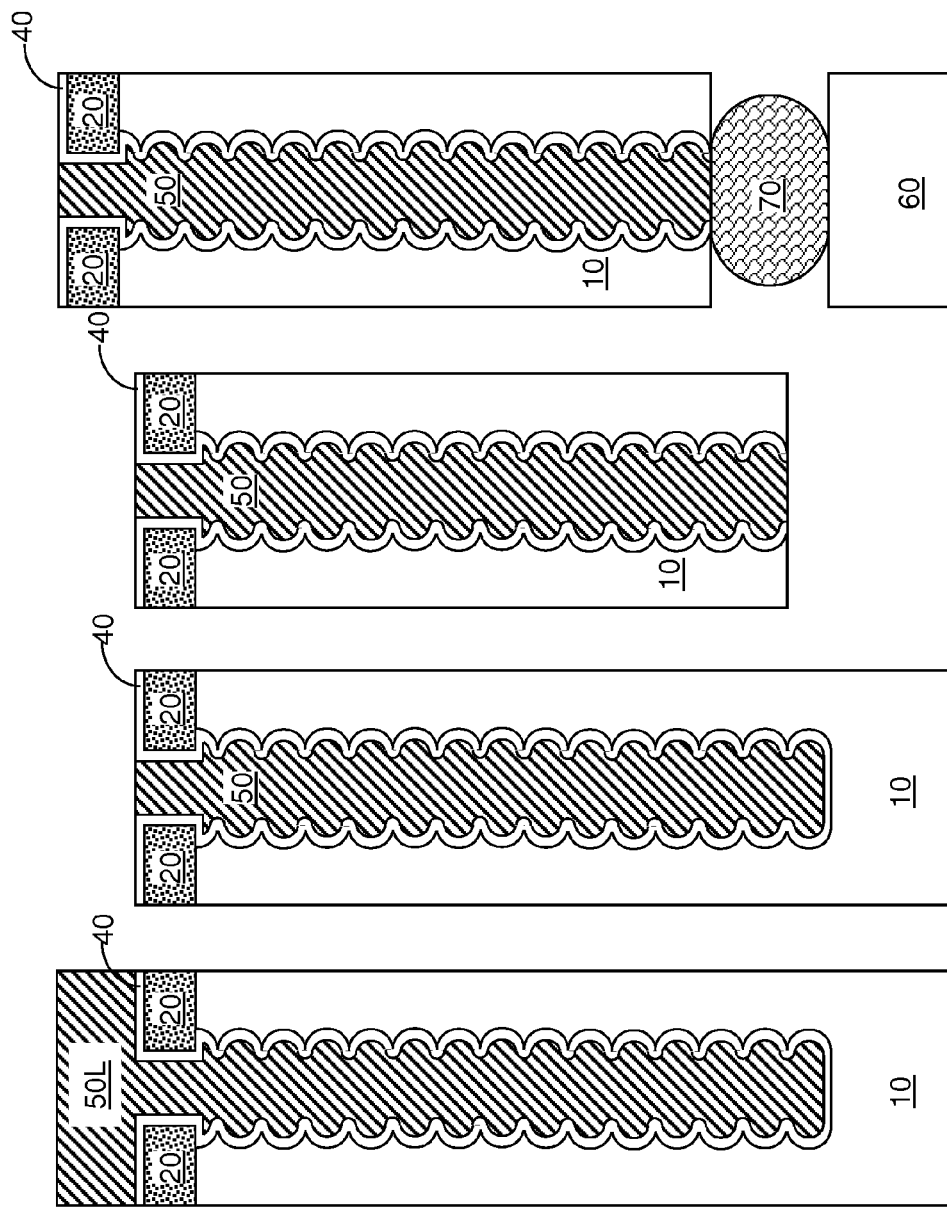

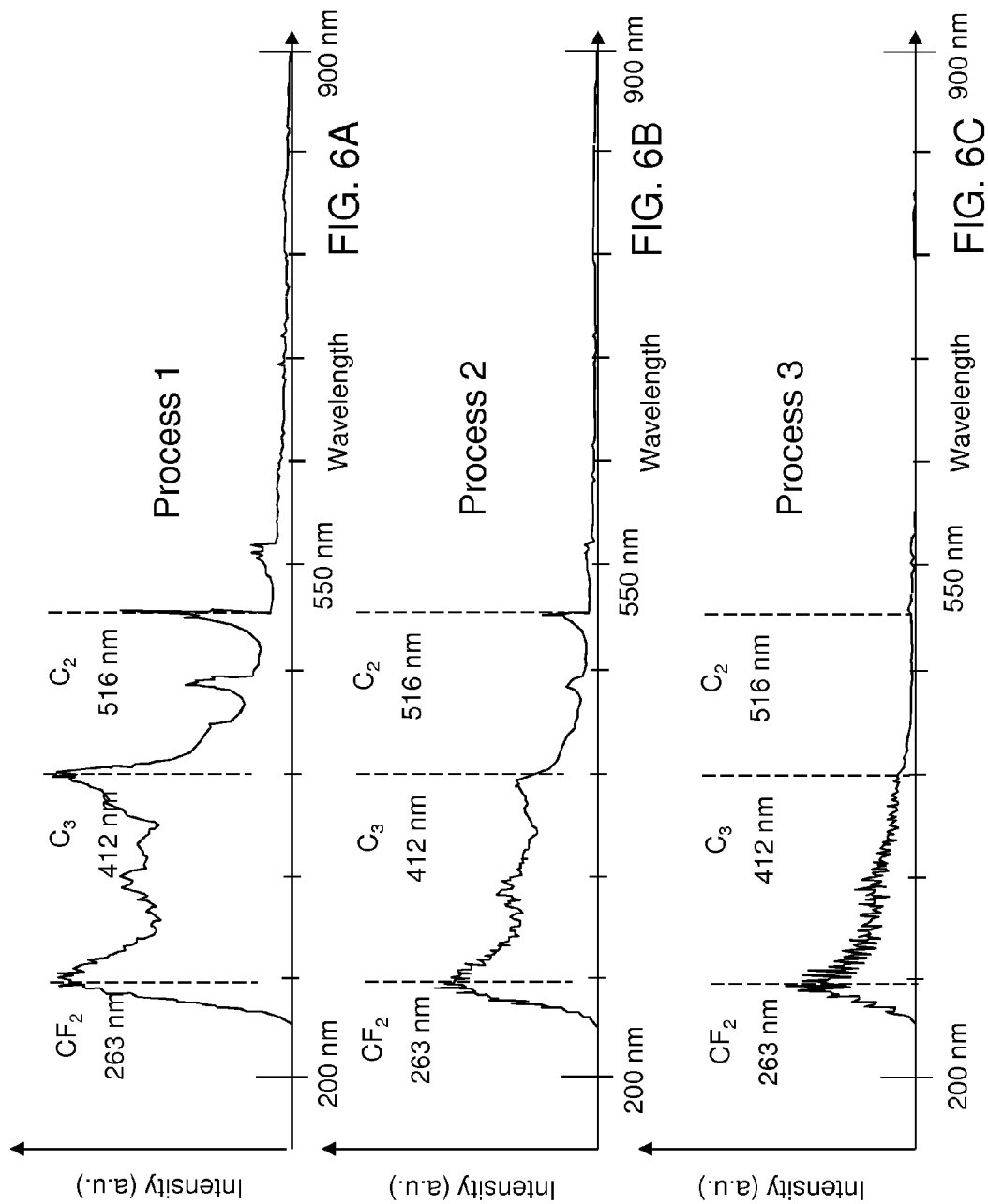

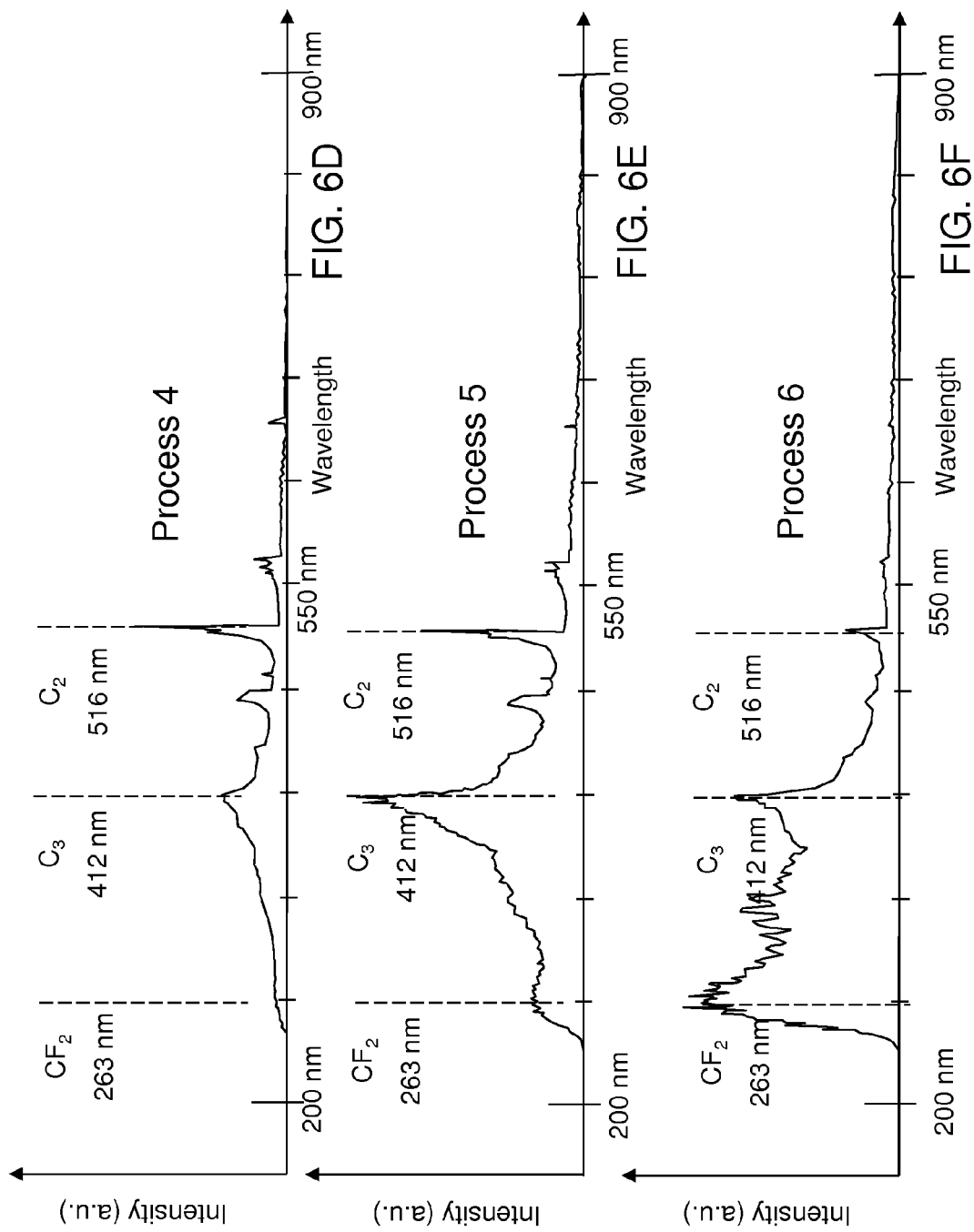

HIGH ASPECT RATIO AND REDUCED UNDERCUT TRENCH ETCH PROCESS FOR A SEMICONDUCTOR SUBSTRATE

BACKGROUND

The present disclosure relates to semiconductor processing methods, and particularly to methods for anisotropically etching a high aspect ratio trench in a semiconductor substrate while minimizing an undercut, and structures for effecting the same.

High aspect ratio deep silicon etch techniques are a key enabling technology for implementing through silicon via structures and three-dimensional integration of multiple semiconductor substrates. State of the art deep silicon etch utilizes a time modulated etch process, which is typically referred to as a "Bosch" process.

The Bosch process employs alternating cycles of etching employing a $SF_6$ gas and polymer deposition employing a passivation gas, which is a fluorocarbon gas that does not include hydrogen. The Bosch process provides a reasonable level of anisotropy required for forming high aspect ratio structures. However, the Bosch process, as known in the art, has several limitations. One of such limitations is control of etch profile. Specifically, the cyclical nature of the Bosch process results in sidewall scalloping and undercutting of the etched structures.

To mitigate sidewall scalloping and undercutting of an etch mask (which is a hard mask), increased amounts of the passivation gas may be employed. However, increasing the amount of the passivation gas supplied into the process chamber to reduce sidewall scalloping and undercutting significantly reduces the etch rate of the process, thereby severely limiting the throughput of the process. Undercutting of the hard mask results in formation of voids in a through substrate via that is subsequently formed by filling the trench with a conductive material. A large undercut results in a large void within the through substrate via structure, and is a reliability concern for a three-dimensional semiconductor stack having vertical electrical connections through the through substrate via structures.

BRIEF SUMMARY

A hydrofluorocarbon gas is employed as a polymer deposition gas in an anisotropic etch process employing an alternation of an etchant gas and the polymer deposition gas to etch a deep trench in a semiconductor substrate. The hydrofluorocarbon gas can generate a thick carbon-rich and hydrogen-containing polymer on sidewalls of a trench at a thickness on par with the thickness of the polymer on a top surface of the semiconductor substrate. The thick carbon-rich and hydrogen-containing polymer protects sidewalls of a trench, thereby minimizing an undercut below a hard mask without degradation of the overall rate. In some embodiments, an improvement in the overall etch rate can be achieved.

According to an aspect of the present disclosure, a method of forming a semiconductor structure is provided, which includes: providing a stack of a semiconductor substrate and a mask layer having an opening therein, wherein a top surface of the semiconductor substrate is physically exposed at a bottom of the opening; and repeatedly performing a sequence of an etch process and a deposition process on the stack. The etch process removes a semiconductor material at a bottom surface of a trench underlying the opening, and the deposition process deposits a hydrofluorocarbon polymer on the bottom surface and sidewalls of the trench that is generated from a plasma containing ions of a hydrofluorocarbon gas.

According to another aspect of the present disclosure, a semiconductor structure is provided, which includes: a stack of a semiconductor substrate and a mask layer having an opening therein; a trench located within the semiconductor substrate and underlying the opening and having a vertically modulated width; and a hydrofluorocarbon polymer layer contiguously extending from a top surface and sidewalls of the mask layer, through sidewalls of the trench, and to a bottom surface of the trench. The hydrofluorocarbon polymer layer has a first composition at the bottom surface of the trench, the hydrofluorocarbon polymer has a second composition at the sidewalls of the trench, and the second composition is different from the first composition.

BRIEF DESCRIPTION OF THE SEVERAL VIEWS OF THE DRAWINGS

FIGS. 1A-1L are sequential schematic vertical cross-sectional views of an exemplary structure in which a through substrate via structure is formed by filling a deep trench formed by a method according to an embodiment of the present disclosure.

FIGS. 6A-6C are optical emission spectra of three comparative exemplary deposition processes that were generated during research leading to the present disclosure. FIGS. 6D-6F are optical emission spectra for three deposition processes according to embodiments of the present disclosure.

DETAILED DESCRIPTION

Figure 1D:

As stated above, the present disclosure relates to methods for anisotropically etching a high aspect ratio trench in a semiconductor substrate while minimizing an undercut, and structures for effecting the same, which are now described in detail with accompanying figures. Throughout the drawings, the same reference numerals or letters are used to designate like or equivalent elements. The drawings are not necessarily drawn to scale.

Figure 1C:
Figure 1B:
Figure 1A:

Referring to FIG. 1A, an exemplary structure according to an embodiment of the present disclosure includes a semiconductor substrate 10 that includes a semiconductor material. The semiconductor material can be an elemental semiconductor material, a III-V compound semiconductor material, a II-VI compound semiconductor material, or a combination thereof. In one embodiment, the semiconductor material can be a silicon-containing material. For example, the semiconductor material of the semiconductor substrate 10 can include silicon, a silicon-germanium alloy, a silicon-carbon alloy, or a silicon-germanium-carbon alloy. In one embodiment, the semiconductor material can be silicon. The semiconductor material of the semiconductor substrate 10 can be undoped or doped with electrical dopants such as B, Ga, In, P, As, and/or Sb. Semiconductor devices (not shown) and/or metal interconnect structures (not shown) can be included in the upper portion of the semiconductor substrate. The thickness of the semiconductor substrate 10 can be from 30 microns to 2 mm, although lesser and greater thicknesses can also be employed.

A mask layer 20 is formed on the top surface of the semiconductor substrate 10, and is patterned to form openings therein. It is understood that a plurality of openings can be formed in the mask layer 20 although a single opening is illustrated in FIGS. 1A-1L. The mask layer 20 can be a hard mask layer including a dielectric material or a metallic material. Dielectric materials that can be employed for the mask layer 20 include, but are not limited to a dielectric material selected from doped silicon oxide, undoped silicon oxide, silicon nitride, silicon oxynitride, a dielectric metal oxide, and a combination thereof. Metallic materials that can be employed for the mask layer 20 include, but are not limited to, TiN, TaN, WN, WC, TiC, TaC, W, Ti, Ta, Cu, Al, and combinations or alloys thereof. The mask layer 20 can be patterned, for example, by applying a photoresist (not shown) thereupon, patterning the photoresist by lithographic exposure and development, and transferring the pattern in the photoresist into the mask layer 20 employing an etch, which can be an anisotropic etch such as a reactive ion etch or an isotropic etch such as a wet etch. Alternatively, the mask layer 20 can include an organic material such as a patterned photoresist material or a patterned layer of an optically planarizing material as known in the art. The thickness of the mask layer 20 can be from 0.2 microns to 10 microns, although lesser and greater thicknesses can also be employed.

The width w of an opening in the mask layer 20 can be from 1 micron to 70 microns, although lesser and greater widths w can also be employed. The opening can have a shape of a circle, an ellipse, or rectangle in which the lesser distance between two pairs of sides corresponds to the width w.

Referring to FIG. 1B, the exemplary structure is placed in a process chamber configured to generate a plasma therein. The process chamber can be, for example, a reactive ion etch chamber configured to generate a plasma by coupling radio frequency (RF) electromagnetic field to the a gas therein.

For example, the process chamber can be a vacuum chamber including a lower electrode on which the exemplary structure is mounted, and an upper electrode vertically spaced from the exemplary structure by a spacing. The power coupled to the plasma through the RF electromagnetic field is herein referred to as a plasma power. In addition, a constant voltage bias can be applied between the lower electrode and the upper electrode to induce the ions in the plasma to impinge on the substrate in contact with the lower electrode. The power coupled to the plasma through the constant voltage bias is herein referred to as a bias power. The oscillating electric field ionizes the gas molecules by stripping electrons from the gas molecules, thereby creating a plasma.

Once the exemplary structure is loaded into the process chamber such that the bottom surface of the semiconductor substrate 10 contacts the lower electrode, and the upper electrode is more proximal to the mask layer 20 than to the bottom surface of the semiconductor substrate 10, an etchant gas is flowed into the process chamber, for example, employing a mass flow controller. A non-limiting example of the etchant gas is sulfur hexafluoride ($SF_6$). Other etchant gases known in the art such as, for example, $CF_4$, $CHF_3$, $Cl_2$, HBr, and/or combinations thereof can also be employed to remove the semiconductor material of the semiconductor substrate 10.

An etch process is performed by generating a plasma of the etchant gas. The plasma of the etchant gas can be generated in the process chamber by applying a bias voltage and an RF electromagnetic field, and thereby coupling the plasma power and the bias power to the etchant gas. The etchant gas is ionized to form a plasma containing etchant ions. The etchant ions are accelerated toward the exemplary structure to etch the semiconductor material of the semiconductor substrate 10. Because of statistical distribution of velocity of the radicals in the plasma and the associated efficacy for forming volatile adsorbates, a lateral etch accompanies a vertical etch of the semiconductor material in the semiconductor substrate 10. Thus, a trench 11 formed underneath each opening in the mask layer includes a peripheral undercut region. The undercut region of the trench 11 is the portion of the trench 11 that does not overlap the area of an overlying opening in the mask layer 20 in a top-down view in a direction perpendicular to the interface between the semiconductor substrate 10 and the mask layer 20. The undercut region is formed directly underneath portions of the mask layer 20 around the corresponding opening in the mask layer 20.

The pressure of the plasma of the etchant ions can be from 1 mTorr to 30 mTorr, although lesser and greater pressures can also be employed. The etch rate of the semiconductor material during the etch process can be from 1 micron per minute to 10 microns per minute, although lesser and greater etch rates can also be achieved. The temperature of the etch process can be from −30 degrees Centigrade to 60 degrees Centigrade, although lesser and greater temperatures can also be employed. The time duration of the etch process can be from 1 second to 1 minute, although lesser and greater time durations can also be employed.

Referring to FIG. 1C, after the etch process is performed for a time period, a deposition process is performed in the same process chamber. Specifically, the etchant gas in the process chamber is pumped out of the process chamber, and a deposition gas is flowed into the process chamber, for example, employing a mass flow controller. The deposition gas includes a hydrofluorocarbon gas having a chemical formula of $C_xH_yF_z$, wherein x is an integer selected from 3, 4, 5, 6, and 7, y and z are positive integers not greater than 15. Hydrofluorocarbon gas having a chemical formula of $C_xH_yF_z$, wherein x is an integer selected from 4, 5, 6, and 7, y and z are positive integers not greater than 15 is preferable. Hydrofluorocarbon gas having unsaturated bond such as double bond, triple bond and cyclic structure is preferable. It is preferable that a ratio of fluorine atom to carbon atom of hydrofluorocarbon is greater than 0.6 and not greater than 2.0. For example the hydrofluorocarbon gas can include [C3] 1,1-difluoropropene, 1,2-difluoropropene, 1,3-difluoropropene, 2,3-difluoropropene, 3,3-difluoropropene, 1,1-difluorocypropane, 1,2-difluorocypropane, 1,1,2-trifluoropropene, 1,1,3-trifluoropropene, 1,2,3-trifluoropropene, 1,3,3-trifluoropropene, 2,3,3-trifluoropropene, 3,3,3-trifluoropropene, 1,1,2-trifluorocypropane, 1,2,3-trifluorocypropane, 1,1,2,3-tetrafluoropropene, 1,1,3,3-tetrafluoropropene, 1,2,3,3-tetrafluoropropene, 1,3,3,3-tetrafluoropropene, 2,3,3,3-tetrafluoropropene, 1,1,2,2-tetrafluorocypropane, 1,1,2,3-tetrafluorocypropane, 1,3-difluoropropyne, 3,3-difluoropropyne, 1,2-difluoropropadiene, 1,3-difluoropropadiene, 1,3,3-trifluoropropyne, 3,3,3-trifluoropropyne, 1,1,3-trifluoropropadiene, [C4] 3,3,4,4-tetrafluorocyrobutene, 1,3,3,4,4-pentafluorocyrobutene, 1,1,2,2,3,4-hexafluorocyrobutane, 1,1,2,2,3-pentafluorocyrobutane, 1,1,2,2,3,3,4-heptafluorocyrobutane, 1,1,1,4,4,4-hexafluoro-2-butene, 3,3,3-trifluoro-2-trifluoromethylpropene, 1,1,2,3,4-pentafluoro-1,3-butadiene, 1,1,2,4,4-pentafluoro-1,3-butadiene, 1,1,2,3-tetrafluoro-1,3-butadiene, 1,1,2,4-tetrafluoro-1,3-butadiene, 1,1,3,4-tetrafluoro-1,3-butadiene, 1,2,3,4-tetrafluoro-1,3-butadiene, 1,1,4,4-tetrafluoro-1,3-butadiene, 1,1,2-trifluoro-1,3-butadiene, 1,1,3-trifluoro-1,3-butadiene, 1,1,4-trifluoro-1,3-butadiene, 1,2,3-trifluoro-1,3-butadiene, 1,2,4-trifluoro-1,3-butadiene, 1,1,2,3-tetrafluoro-1-butene, 1,1,2,4-tetrafluoro-1-butene, 1,1,3,3-tetrafluoro-1-butene, 1,1,3,4-tetrafluoro-1-butene, 1,1,4,4-tetrafluoro-1-butene, 1,2,3,3-tetrafluoro-1-butene, 1,2,3,4-tetrafluoro-1-butene, 1,2,4,4-tetrafluoro-1-butene, 1,3,3,4-tetrafluoro-1-butene, 1,3,4,4-tetrafluoro-1-butene, 1,4,4,4-tetrafluoro-1-butene, 2,3,3,4-tetrafluoro-1-butene, 2,3,4,4-tetrafluoro-1-butene, 2,4,4,4-tetrafluoro-1-butene, 3,3,4,4-tetrafluoro-1-butene, 3,4,4,4-tetrafluoro-1-butene, 1,1,1,2-tetrafluoro-2-butene, 1,1,1,3-tetrafluoro-2-butene, 1,1,1,4-tetrafluoro-2-butene, 1,1,2,3-tetrafluoro-2-butene, 1,1,2,4-tetrafluoro-2-butene, 1,1,3,4-tetrafluoro-2-butene, 1,1,4,4-tetrafluoro-2-butene, 1,2,3,4-tetrafluoro-2-butene, 1,1,3,3-tetrafluoro-2-methylpropane, 1,1,3-trifluoro-2-fluoromethylpropane, 1,3,3-trifluoro-2-fluoromethylpropane, 3,3-difluoro-2-difluoromethylpropane, 1,1,2,2-tetrafluorocyrobutane, 1,1,2,3-tetrafluorocyrobutane, 1,1,3,3-tetrafluorocyrobutane, 1,2,3,4-tetrafluorocyrobutane, 1-fluoro-1-trifluoromethylcycropropane, 2-fluoro-1-trifluoromethylcycropropane, 1,1-difluoro-1-difluoromethylcycropropane, 1,2-difluoro-1-difluoromethylcycropropane, 2,2-difluoro-1-difluoromethylcycropropane, 2,3-difluoro-1-difluoromethylcycropropane, 1,2,2-trifluoro-1-fluoromethylcycropropane, 1,2,3-trifluoro-1-fluoromethylcycropropane, 2,2,3-trifluoro-1-fluoromethylcycropropane, 1,2,2,3-tetrafluoro-1-methylcycropropane, 2,2,3,3-tetrafluoro-1-methylcycropropane, [C5] 1,3,3,4,4,5,5-heptafluorocycropentene, 3,3,4,4,5,5-hexafluorocycropentene, 1,1,2,2,5,5-hexafluorocycropentane, 1,1,1,3,4,4,5,5,5-nonafluoro-2-pentene, 1,1,1,2,4,4,5,5,5-nonafluoro-2-pentene, 2,3,4,5,5,5-hexafluoro-1,3-pentadiene, 1,3,4,5,5,5-hexafluoro-1,3-pentadiene, 1,2,4,5,5,5-hexafluoro-1,3-pentadiene, 1,2,3,5,5,5-hexafluoro-1,3-pentadiene, 1,2,3,4,5,5-hexafluoro-1,3-pentadiene, 1,2,4,5,5,5-hexafluoro-1,3-pentadiene, 1,1,2,3,4,-pentafluoro-1,3-pentadiene, 3,4,5,5,5-pentafluoro-1,3-pentadiene, 1,2,3,3,4-pentafluoro-1,4-pentadiene, 1,1,2,3,3-pentafluoro-1,4-pentadiene, 1,3,3,4,4-pentafluoro-2-methylcycrobutene, 2-fluoro-1-trifluoromethylcycrobutene, 3,3,4,4-tetrafluoro-1-trifluoromethylcycrobutene, [C6] 1,3,3,4,4,5,5,6,6-nonafluorocycrohexene, 3,3,4,4,5,5,6,6-octafluorocycrohexene, 1,1,3,3-tetrafluoro-2-trifluoromethylcycropentane, 4,5,5,5-tetrafluoro-3-trifluoromethyl-1,3-pentadiene, 1,1,2,4,5,5,5-heptafluoro-3-methyl-1,3-pentadiene, 1,2-bis(trifluoromethyl)cycrobutane, 1,2-bis(trifluoromethyl)cycrobutene, 3,4-bis(trifluoromethyl)cycrobutene, 1,1,1-trifluoro-2-trifluoromethyl-3-methyl-2-butene, 1,1,1-trifluoro-3-trifluoromethyl-2-methyl-2-butene, 1,1,1,-trifluoro-3-trifluoromethyl-2-pentene, 4,4,5,5,5-pentafluoro-3-methyl-2-pentene, [7] 1,3,3,4,4,5,5,6,6,7,7-undecafluorocycroheptene, 3,3,4,4,5,5,6,6,7,7-decafluorocycroheptene, 1,3,3,4,4,5,5-heptafluoro-2-ethylcycropentene, 3,3,4,4,5,5-hexafluoro-1,2-dimethylcycropentene and 1,2-bis(fluoromethyl)cycropentene, but these are non-limiting examples of specific embodiments of the present disclosure. In one embodiment, the hydrofluorocarbon gas is 1,3,3,4,4,5,5-heptafluorocycropentene as $C_5HF_7$.

A deposition process is performed by generating a plasma of the deposition gas. The plasma of the deposition gas can be generated in the process chamber by applying a bias voltage and an RF electromagnetic field, and thereby coupling the plasma power and the bias power to the deposition gas. The deposition gas is ionized to form a plasma of hydrofluorocarbon ions. The hydrofluorocarbon ions are accelerated toward the exemplary structure to deposit a hydrofluorocarbon polymer layer 30 on the top surface and sidewalls of the mask layer 20, and on the sidewalls and the bottom surface of the trench 11 within the semiconductor substrate 10. Because of statistical distribution of velocity of the radicals in the plasma, the hydrofluorocarbon polymer layer 30 is deposited as a contiguous layer that contacts the entirety of the top surface and sidewalls of the mask layer 20, and the sidewalls and the bottom surface of the trench 11 within the semiconductor substrate 10.

Various portions of the hydrofluorocarbon polymer layer 30 can have different compositions and different thicknesses due to different anisotropy for each species of ions present in the plasma. Further, various portions of the hydrofluorocarbon polymer layer 30 can have different thicknesses. For example, a portion of the hydrofluorocarbon polymer layer 30 located at a bottom of the trench 11 can have a bottom polymer thickness tp_b, a portion of the hydrofluorocarbon polymer layer 30 located at a sidewall of the trench 11 and a sidewall of the mask layer 20 can have a sidewall polymer thickness tp_s, and a portion of the hydrofluorocarbon polymer layer 30 located at a top surface of the mask layer 20 can have a top polymer thickness tp_t.

The pressure of the plasma can be from 1 mTorr to 30 mTorr, although lesser and greater pressures can also be employed. The deposition rate of the hydrofluorocarbon polymer material of the hydrofluorocarbon polymer layer 30 at various locations can be from 50 nm per minute to 500 nm per minute, although lesser and greater deposition rates can also be employed. The temperature of the deposition process can be from −30 degrees Centigrade to 60 degrees Centigrade, although lesser and greater temperatures can also be employed. The time duration of the etch process can be from 0.5 second to 30 seconds, although lesser and greater time durations can also be employed.

Referring to FIG. 1D, the etch process of FIG. 1B is performed again. The parameters for generating the plasma of the etchant radicals and ions are selected such that the etchant ions impinge on the exemplary structure are aligned predominantly along a surface normal of the interface between the semiconductor substrate 10 and the mask layer 20. The hydrofluorocarbon polymer layer 30 is etched anisotropically such that horizontal portions of the hydrofluorocarbon polymer layer 30 located at a bottom surface of the trench 11 and on the top surface of the mask layer 20 are etched, while portions of the hydrofluorocarbon polymer layer 30 located on the sidewalls of the mask layer 20 and the sidewalls of the trench 11 are not removed. The species of the etchant gas and the other parameters for generating the plasma of the etchant radicals and ions can be the same as in the etch process of FIG. 1B. In one embodiment, etch process employs a plasma of a fluorine-containing etchant such as $SF_6$, and substitutes a fraction of hydrogen atoms in the hydrofluorocarbon polymer material in the hydrofluorocarbon polymer layer 30 with fluorine atoms prior to removing a fluorine-enhanced hydrofluorocarbon material.

Figure 1H:
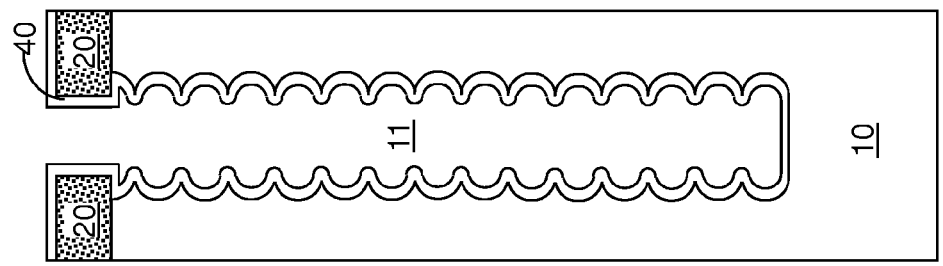
Figure 1G:
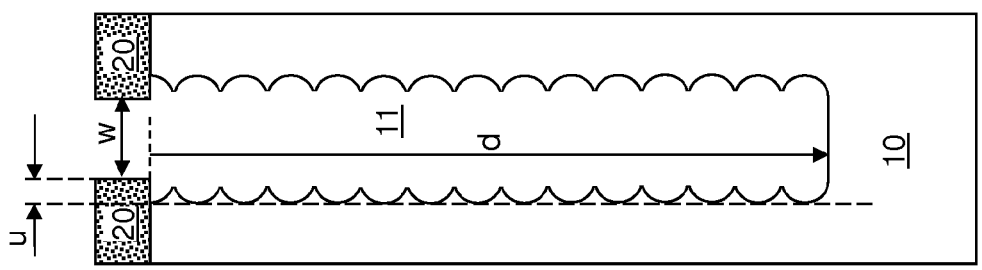
Figure 1F:
Figure 1E:

Referring to FIG. 1E, the time duration of the etch process that is initiated at the step of FIG. 1D is selected such that the etch process continues after a bottom portion of the hydrofluorocarbon polymer layer 30 is removed and a semiconductor surface is physically exposed at the bottom of the trench 30. The etchant plasma commences etching of the semiconductor material of the semiconductor substrate 10 such that a vertical etch and a lateral etch of the semiconductor material occur simultaneously, while a remaining portion of the hydrofluorocarbon polymer layer 30 at the sidewalls of the trench 11 protect the semiconductor material around the remaining portion of the hydrofluorocarbon polymer layer 30. The trench 11 is extended downward to add a newly added cavity volume. The lateral extent of the newly added cavity volume modulates vertically such that the lateral extent increases gradually and then gradually decreases as a function of depth from the level of the bottom surface of the trench 11 at the end of the processing step of FIG. 1D. The time duration of this etch process can be selected such that the hydrofluorocarbon polymer layer 30 is completely removed, or only minimally present, at the end of this etch process.

Referring to FIG. 1F, once the etch process of FIGS. 1D and 1E is completed, the deposition process of FIG. 1C can be repeated to deposit the same type of a hydrofluorocarbon polymer material, and to form another hydrofluorocarbon polymer layer 30. The process parameters of this deposition step can be substantially the same as the process parameters of the step of FIG. 1C.

In general, a sequence of the etch process described above and the deposition process described above is repeated on the stack of the semiconductor substrate 10 and the mask layer 20 including openings. Each etch process removes a semiconductor material at a bottom surface of the trench 11 underlying an opening, and the deposition process deposits a hydrofluorocarbon polymer layer 30 on the bottom surface and sidewalls of the trench 11 as well as the top surface and the sidewalls of the mask layer 20. The hydrofluorocarbon polymer material of the hydrofluorocarbon polymer layer 30 is generated from a plasma containing ions of the hydrofluorocarbon gas.

At the end of each deposition step, a hydrofluorocarbon polymer layer 30 is contiguously deposited on the top surface and sidewalls of the mask layer 20 and on the sidewalls and the bottom surface of the trench 11 within the semiconductor substrate 10. The hydrofluorocarbon polymer layer 30 includes a first hydrofluorocarbon polymer portion 30A deposited on the bottom surface of the trench 11 and having a first composition and a first thickness, a second hydrofluorocarbon polymer portion 30B deposited on the sidewalls of the trench 11 and the sidewalls of the mask layer 20, and a third hydrofluorocarbon polymer portion 30C deposited on the top surface of the mask layer 20 and having a third composition and a third thickness.

At the end of each deposition step, the exemplary structure is a semiconductor structure including a stack of the semiconductor substrate 10 and the mask layer 20 having an opening therein, the trench 11 that is located within the semiconductor substrate 10 and underlies the opening and has an vertically modulated width, and a hydrofluorocarbon polymer layer 30 that extends from the top surface and sidewalls of the mask layer 20, through sidewalls of the trench 11, and to the bottom surface of the trench 11. The hydrofluorocarbon polymer layer 30 has a first composition at the bottom surface of the trench 11, a second composition at the sidewalls of the trench 11, and the second composition is different from the first composition. Specifically, the second composition includes more hydrogen than the first composition, and less fluorine than the first composition as will be discussed below.

The repeated performance of the sequence of the etch process and the deposition process forms modulations in the lateral dimension, i.e., the width, within the trench 11 as a function of depth from the interface between the top surface of the semiconductor substrate 11 and the mask layer 20. The total number of repetitions of the sequence of the etch process and the deposition process can be from 2 to 1,000, and typically from 30 to 200, although a greater number of repetitions can also be employed. Each repetition of the sequence of the etch process and the deposition extends the trench 11 downward to add a newly added cavity volume. The lateral extent of the newly added cavity volume modulates vertically such that the lateral extent increases gradually and then gradually decreases as a function of depth from the level of the bottom surface of the trench 11 at the end of the processing step of FIG. 1D. The time duration of this etch process can be selected such that the hydrofluorocarbon polymer layer 30 is completely removed, or only minimally present, at the end of each etch process.

Figure 2:
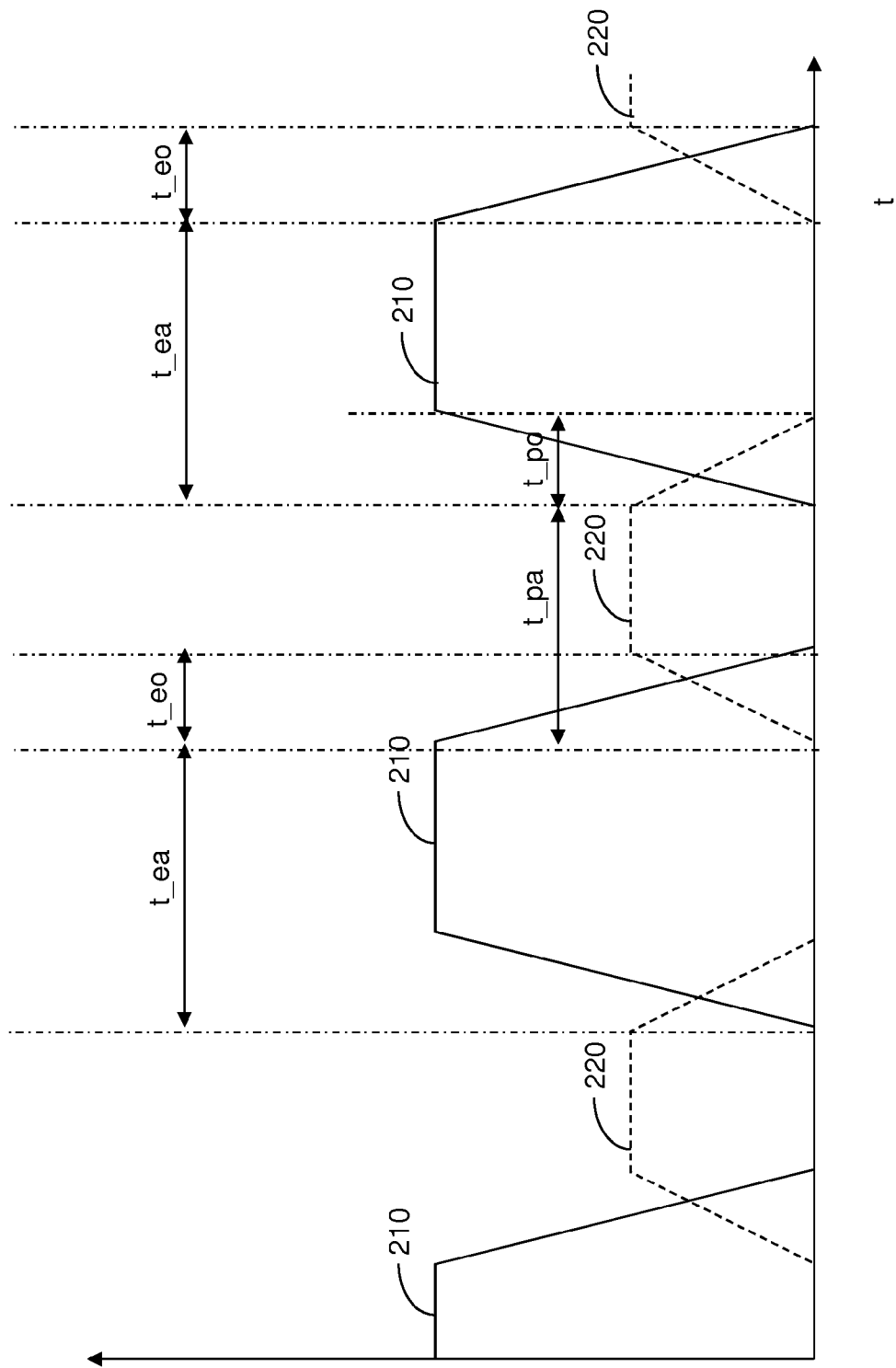
FIG. 2 is a schematic diagram illustrating a flow of an etchant gas and a flow of a deposition gas into a process chamber during a trench etch process according to an embodiment of the present disclosure.

Referring to FIG. 2, the flow rate of the etchant gas and the deposition gas, i.e., the hydrofluorocarbon gas, into the process chamber is schematically illustrated as a function of time 2. An etchant gas flow rate curve 210 and a deposition gas flow rate curve 220 are illustrated in the graph of FIG. 2. The time duration represented by t_ea corresponds to an etching active time, during which etching of the semiconductor material of the semiconductor substrate 10 occurs. The value for t_ea can be from 1 second to 1 minute as discussed above, although lesser and greater values can also be employed. The time duration represented by t_pa corresponds to a passivation active time, during which the deposition of the hydrofluorocarbon polymer material occurs, and the bottom surface and the sidewalls of the trench 11 are passivated by the hydrofluorocarbon polymer material. The value for t_pa can be from 0.5 second to 30 seconds as discussed above, although lesser and greater values can also be employed. The time duration represented by t_eo corresponds to an etch overlap time, during which the etch rate of the semiconductor material is ramped down and the deposition rate for the hydrofluorocarbon polymer material is ramped up. The ratio of t_eo to t_pa can be from 0 to 0.5. The time duration represented by t_po corresponds to a passivation overlap time, during which the deposition rate for the hydrofluorocarbon polymer material is ramped down and the etch rate of the semiconductor material in the semiconductor substrate 10 is ramped up. The ratio of t_pa to t_ea can be from 0 to 0.5.

In one embodiment, the flow rate of the etchant gas and flow rate of the deposition gas can be controlled such that the ramp down time period for the flow rate of the etchant gas overlaps with the ramp up time period for the flow rate of the deposition gas, and the ramp up time period for the flow rate of the etchant gas overlaps with the ramp down time period for the flow rate of the deposition gas. In another embodiment, the time duration for flow of the etchant gas and the time duration for the flow of the deposition gas can be mutually exclusive, i.e., t_eo and t_po can be zero. The maximum value for the flow rate of the etchant gas and the maximum value for the flow rate of the deposition gas depends on the species of the etchant gas and the deposition gas, the size of the process chamber, and the pressures of the etchant gas plasma and the deposition gas plasma. In a non-limiting illustrative example, if sulfur hexafluoride is employed as the etchant gas and the process chamber is of a size that accommodates a 300 mm diameter substrate, the maximum value for the flow rate of the etchant gas can be from 10 sccm to 600 sccm, and the maximum value for the flow rate of the deposition gas, i.e., the hydrofluorocarbon gas having a chemical formula of $C_xH_yF_z$, wherein x is an integer selected from 3, 4, 5, 6, and 7, y and z are positive integers not greater than 15, can be from 20 sccm to 1,000 sccm.

Referring to FIG. 1G, the last the sequence of the etch process and the deposition process can be followed by another etch process that extends the trench 11 downward for the last time. The trench 11 as provided after the last etch process has a vertically modulating width, which is herein referred to as "scalloping." One cycle of modulation of the width of the trench 11 corresponds to an etch process within a sequence. The total number of cycles in the modulation of the width of the trench 11 is the same as the sum of the number of repetitions of the sequence of the etch process and the number 1, which corresponds to the last etch process that is not followed by a deposition process.

The depth d of the trench can be from 20 microns to 200 microns, although lesser and greater depths can also be employed. The lateral distance between the outermost lateral extent of a sidewall of the trench 11 and a sidewall of the mask layer 20 that is most proximal to that sidewall of the trench 11 in a vertical cross-sectional view in a widthwise direction of the trench 11 is herein referred to as an "undercut dimension" u of the trench 11. As used herein, a widthwise direction of the trench 11 is a direction along which the lateral separation distance between two opposing sidewalls is minimized. If the shape of the opening in the mask layer 20 is circular, any vertical passing through a vertical center axis of the trench 11 is a widthwise direction. If the shape of the opening in the mask layer 20 is rectangular, the widthwise direction is the direction of a shorter pair of sides of the rectangle that defines a periphery of the opening in a top-down view.

In a non-limiting illustrative example, the undercut dimension u of the trench 11 can be on the order of 300 nm if the width w of the opening is from 3 micron to 5 micron and the depth d of the trench is on the order of 50 microns, and gradually increases to be on the order of 600 nm if the width w of the opening is on the order of 50 microns and the depth d of the trench 11 is on the order of 100 microns. The lateral modulation of a sidewall of the trench 11 as seen in a vertical cross-sectional view in the widthwise direction can be from 5% to 30% of the undercut dimension.

Referring to FIG. 1H, the surfaces of the trench 11 can be cleaned, for example, by a wet clean. Optionally, the mask layer 20 may, or may not, be removed. A dielectric liner 40 is deposited on the sidewalls of the trench 11 by a conformal deposition process such as chemical vapor deposition or atomic layer deposition. The dielectric liner 40 includes a dielectric material such as silicon oxide, silicon nitride, silicon oxynitride, a dielectric metal oxide, or a combination thereof. The thickness of the dielectric liner 40 can be from 50 nm to 1,000 nm, although lesser and greater thicknesses can also be employed.

Referring to FIG. 1I, a conductive material layer 50L can be deposited to fill the trench 11. The conductive material layer 50L can be deposited, for example, by chemical vapor deposition, electroplating, electroless plating, or a combination thereof. The conductive material layer 50L can include a metallic material such as Cu, Al, W, TaN, TiN, WN, or a combination thereof.

Referring to FIG. 1J, the conductive material layer 50L can be planarized to form a through substrate via structure 50, for example, by chemical mechanical planarization. The dielectric liner 40 and/or the mask layer 20 can be employed as a stopping layer for the planarization process.

Referring to FIG. 1K, a bottom portion of the semiconductor substrate 10 can be removed, for example, by grinding or chemical mechanical planarization to physically expose a bottom portion of the through substrate via structure 50. A surface of the dielectric liner 40 is also physically exposed around the bottom surface of the through substrate via structure 50.

Referring to FIG. 1L, the semiconductor substrate 10 can be bonded to a substrate 60, for example, through a C4 ball 70. The substrate 60 can be another semiconductor substrate, a transposer, or a packaging substrate.

Figure 3:
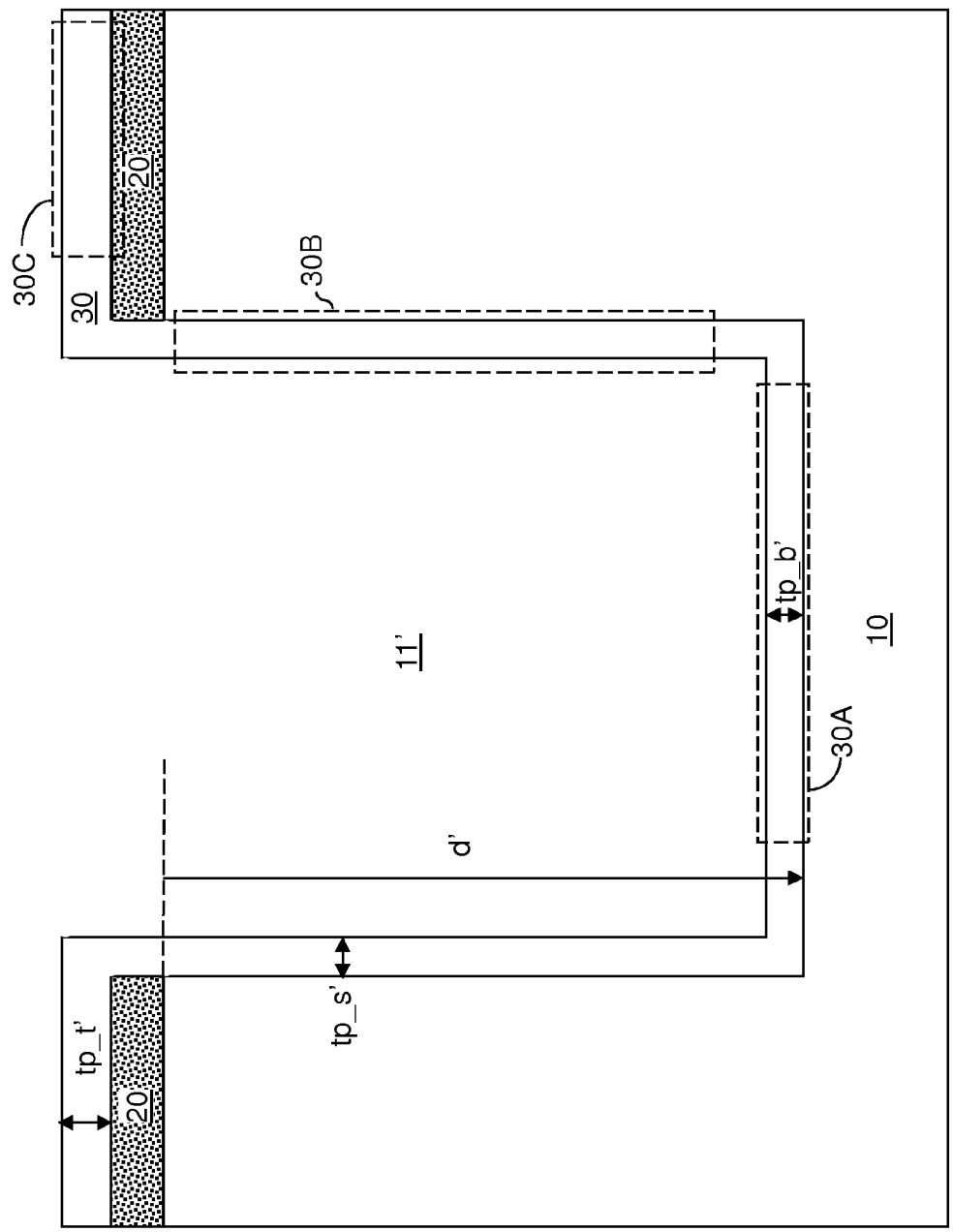
FIG. 3 is a schematic vertical cross-sectional view of an exemplary test structure employed to measure deposition rate of hydrofluorocarbon polymers deposited during a deposition step of a trench etch process according to an embodiment of the present disclosure.

Referring to FIG. 3, an exemplary test structure is schematically illustrated in a vertical cross-sectional view. In the course of research leading to the present disclosure, test structures having the same configuration as the exemplary test structure were employed to characterize the properties of the hydrofluorocarbon polymer material that is deposited during the deposition steps among the repetitive processing sequence between the processing step of FIG. 1B and the processing step of FIG. 1G.

The exemplary test structure of FIG. 3 can be formed, for example, by forming a mask layer 20 on a semiconductor substrate, patterning an opening in the mask layer, and transferring the pattern of the opening into an upper portion of the semiconductor substrate 10 to a depth d' to form a trench 11' within the semiconductor substrate 10. The depth d' can be from 20 microns to 200 microns. The width of the trench 11' can be from 10 microns to 200 microns so that a hydrofluorocarbon polymer material at the bottom of the trench 11' has a sufficiently large area for analysis in analytical instruments. The trench 11' can be formed employing the processing steps of FIGS. 1A-1G. The modulation of the trench sidewalls and the undercut dimension of the trench 11' are not shown in FIG. 3 for simplicity.

The exemplary test structure can be placed in a processing chamber, and a deposition process is performed which is the same as one of the deposition processes among the repetitive processing sequence of FIGS. 1B-1G. For example, the deposition process of FIG. 1C or the deposition process of FIG. 1F can be performed with modification to the time duration of the deposition process. The time duration of the deposition process for forming the exemplary test structure illustrated in FIG. 3 is selected such that sufficient amount of the hydrofluorocarbon polymer material is deposited on the top surface and sidewalls of the mask layer 20 and the sidewalls and the bottom surface of the trench 11'. In a non-limiting illustrative example, the thicknesses of the hydrofluorocarbon polymer material at various portions of a hydrofluorocarbon polymer layer 30 can range from 200 nm to 2 microns.

The deposition rate and the thickness of the hydrofluorocarbon polymer material at various locations at the surfaces of the trench 11 and the mask layer 20 at the end of each deposition step, which is included among the repetitive processing sequence between the processing step of FIG. 1B and the processing step of FIG. 1G, can be calculated by measuring the thicknesses of various corresponding portions of the hydrofluorocarbon polymer layer 30 in the exemplary test structure of FIG. 3.

Specifically, the hydrofluorocarbon polymer layer 30 in the exemplary test structure of FIG. 3 includes a first hydrofluorocarbon polymer portion 30A having a bottom polymer thickness tp_b'. The first hydrofluorocarbon polymer portion 30A of FIG. 3 corresponds to the portion of the hydrofluorocarbon polymer layer 30 located at a bottom of the trench 11 and having bottom polymer thickness tp_b in the exemplary structure of FIG. 1C, and also corresponds the first hydrofluorocarbon polymer portion 30A deposited on the bottom surface of the trench 11 in the structures of FIG. 1F and any intermediate structure before the processing step of FIG. 1G immediate after a deposition step. The hydrofluorocarbon polymer layer 30 in the exemplary test structure of FIG. 3 further includes a second hydrofluorocarbon polymer portion 30B having a sidewall polymer thickness tp_s'. The second hydrofluorocarbon polymer portion 30B of FIG. 3 corresponds to the portion of the hydrofluorocarbon polymer layer 30 located at sidewalls of the trench 11 and the mask layer 20 and having sidewall polymer thickness tp_s in the exemplary structure of FIG. 1C, and also corresponds the second hydrofluorocarbon polymer portion 30B deposited on the sidewalls of the trench 11 and the mask layer 20 in the structures of FIG. 1F and any intermediate structure before the processing step of FIG. 1G immediate after a deposition step. In addition, the hydrofluorocarbon polymer layer 30 in the exemplary test structure of FIG. 3 includes a third hydrofluorocarbon polymer portion 30A having a top polymer thickness tp_p'. The third hydrofluorocarbon polymer portion 30C of FIG. 3 corresponds to the portion of the hydrofluorocarbon polymer layer 30 located at the top surface of the mask layer 20 and having top polymer thickness tp_t in the exemplary structure of FIG. 1C, and also corresponds the third hydrofluorocarbon polymer portion 30C deposited on the top surface of the mask layer 20 in the structures of FIG. 1F and any intermediate structure before the processing step of FIG. 1G immediate after a deposition step.

Since the various thicknesses of the hydrofluorocarbon polymer layer 30 in the exemplary structures of FIGS. 1C and 1F and the exemplary test structure of FIG. 3 are linearly proportional to the time duration of the deposition time used for depositing the hydrofluorocarbon polymer layer 30, the deposition rates at the various portions of the hydrofluorocarbon polymer layer 30 in the exemplary structures of FIGS. 1C and 1F and any intermediate structure before the processing step of FIG. 1G immediate after a deposition step can be determined by measuring the thicknesses of the various portions of the hydrofluorocarbon polymer layer 30 in the exemplary test structure of FIG. 3.

EXAMPLES

Non-limiting examples of specific embodiments of the present disclosure are illustrated below, which demonstrate advantages of selected embodiments of the present disclosure. The non-limiting examples are for illustrative purposes only, and do not limit the scope of the present disclosure by any means.

Figure 4:
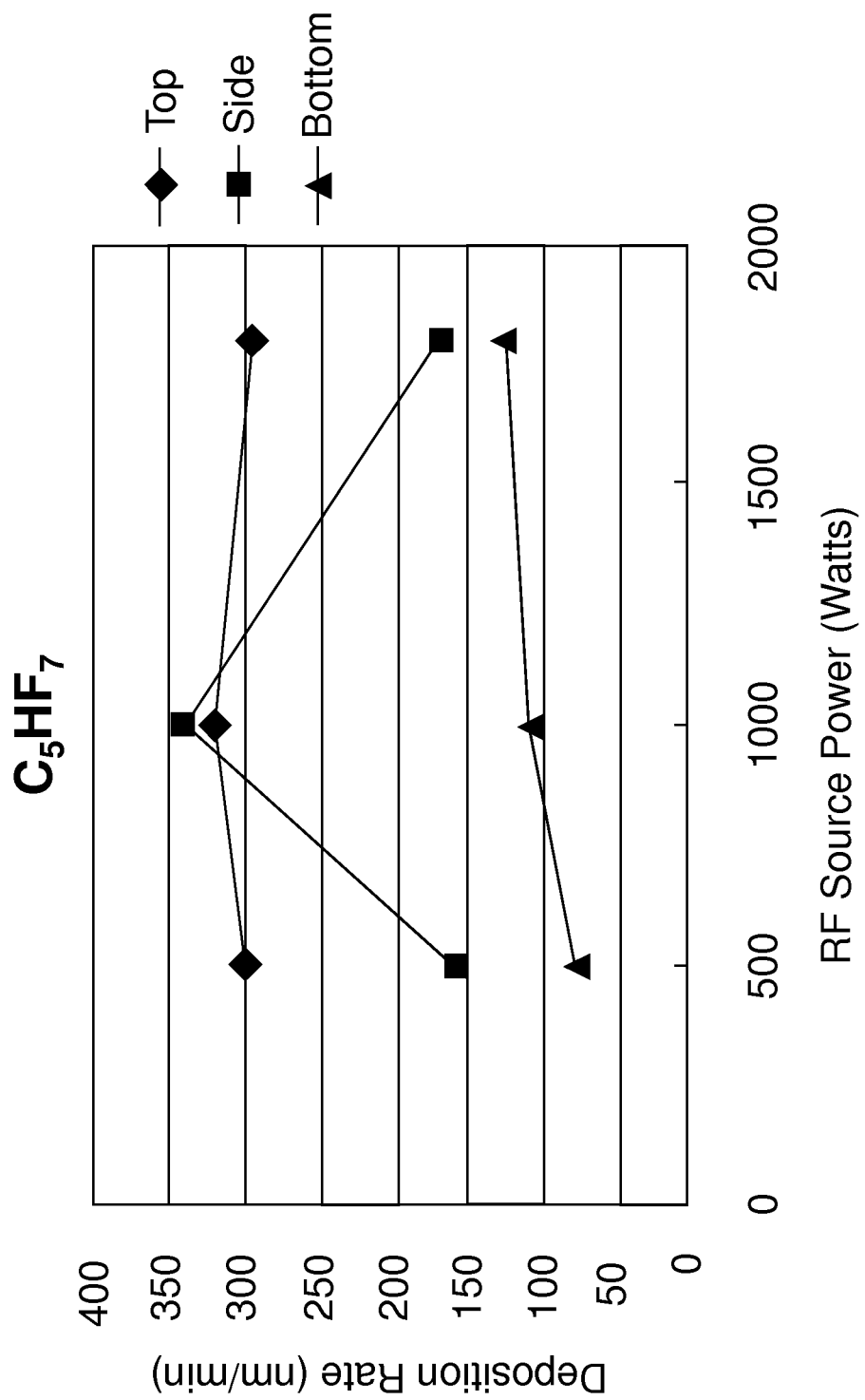
FIG. 4 is a deposition rate, at various locations, of a deposition process employing $C_5HF_7$ gas as a deposition gas as measured on a sample having the configuration of the exemplary test structure of FIG. 3 according to an embodiment of the present disclosure.

Referring to FIG. 4, the deposition rates of the hydrofluorocarbon polymer material at various portions of the hydrofluorocarbon polymer layer 30 is plotted for the case in which the fluorocarbon gas employed to generate the plasma during the deposition step is $C_5HF_7$ gas. In this example, the plasma pressure was 25 mTorr, the depth of the trench 11' was 120 microns, and the width of the trench 11' was 70 microns. The flow rate of the $C_5HF_7$ gas was 150 sccm, and the temperature of the process chamber was 20 degrees Celsius. In the graph, the horizontal axis indicates the RF power coupled to the plasma in Watts.

In the graph of FIG. 4, the deposition rates for the first hydrofluorocarbon polymer portion 30A of FIG. 3 are indicated by a curve labeled "Bottom," the deposition rates for the second hydrofluorocarbon polymer portion 30B in FIG. 3 are indicated by a curve labeled "Side," and the deposition rates for the third hydrofluorocarbon polymer portion 30C in FIG. 3 are indicated by a curve labeled "Top." It is noted that the deposition rates for the first hydrofluorocarbon polymer portion 30A of FIG. 3 are substantially the same as the deposition rates for the first hydrofluorocarbon polymer portion 30A of FIG. 1F under the same deposition condition, the deposition rates for the second hydrofluorocarbon polymer portion 30B in FIG. 3 are substantially the same as the deposition rates for the second hydrofluorocarbon polymer portion 30B of FIG. 1F under the same deposition condition, and the deposition rates for the third hydrofluorocarbon polymer portion 30C in FIG. 3 are substantially the same as the deposition rates for the third hydrofluorocarbon polymer portion 30C of FIG. 1F under the same deposition condition.

At 500 Watts RF source power and 1,800 Watts RF source power, the first deposition rate (represented by the curve labeled "Bottom") is less than the second deposition rate (represented by the curve labeled "Side"), which is less than the third deposition rate (represented by the curve labeled "Top"). This is typical of plasma deposition processes, which produce polymers within the plasma. Thus, the farther away a surface is from the ions of the plasma, the lesser the amount of deposition.

Figure 5:
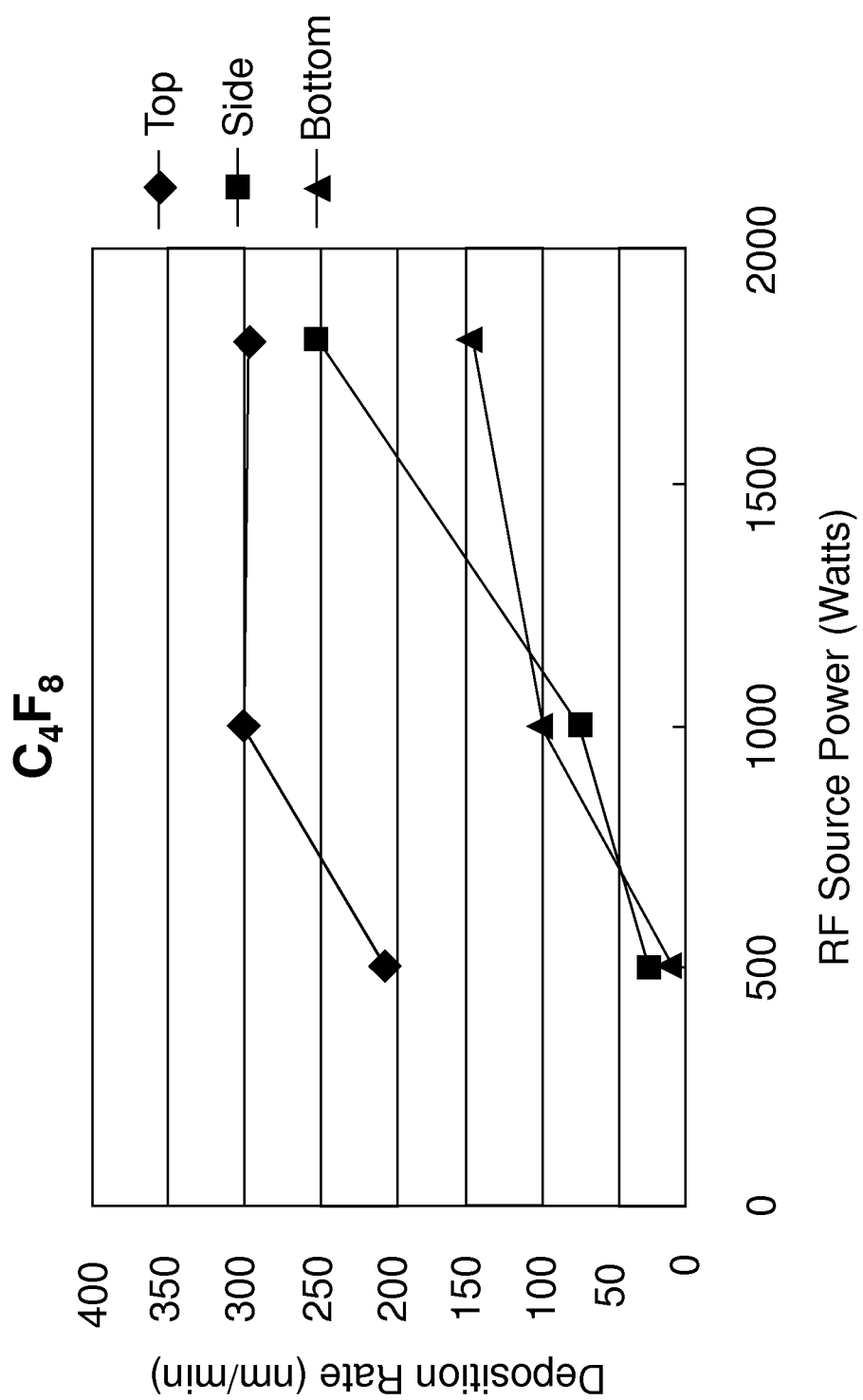
FIG. 5 is a deposition rate, at various locations, of a comparative exemplary deposition process employing $C_4F_8$ gas as a deposition gas as measured on a sample having a configuration of the exemplary test structure of FIG. 3 that was generated during research leading to the present disclosure.

Referring to FIG. 5, deposition rates for a fluorocarbon polymer that does not include hydrogen is illustrate for a comparative exemplary deposition process employing $C_4F_8$ gas as a deposition gas. The deposition rates were measured on a sample having a configuration of the exemplary test structure of FIG. 3, The deposition rate of the fluorocarbon polymer from the comparative exemplary deposition process is the greatest at the top surface of the mask layer 20 as indicated by the curve labeled "Top," which is above curves labeled "Bottom" and "Side" and representing the deposition rates of the fluorocarbon polymer at the bottom surface of the trench and at the sidewalls of the trench, respectively. Further, before the deposition rate at the sidewall of the trench increases to about 90% of the deposition rate at the top surface of the mask layer with the increase in the RF source power, the deposition rate at the bottom of the trench reaches 50% of the deposition rate at the top surface of the mask layer.

Referring back to FIG. 4, at 1,000 Watts RF source power, the deposition rate of the hydrofluorocarbon polymer at sidewalls of the trench 11' is greater than the deposition rate of the hydrofluorocarbon polymer on the top surface of the mask layer 20 in the test structure of FIG. 3. The phenomenon of a greater deposition rate of the hydrofluorocarbon polymer material at sidewalls of a trench than the deposition rate of the hydrofluorocarbon polymer material at the top surface of the mask layer 20 is herein referred to as "superconformity."

The inversion of the ratio of the deposition rate at the sidewalls of the trench 11' to the deposition rate at the top surface of the mask layer 20 from typical values less than 1.0 to a value grater than 1.0 is believed to be caused by differences in the deposition conditions, and in the resulting composition of the hydrofluorocarbon polymers, between the sidewalls of the trench 11' and the top surface of the mask layer 20. At the top surface of the mask layer 20 and at the bottom surface of the trench (11 or 11'), the direct current (DC) bias voltage between the lower electrode and the upper electrode plays a role in accelerating the ions of the plasma toward the horizontal surfaces of the top surface of the mask layer 20 and at the bottom surface of the trench (11 or 11'). At the sidewalls of the trench (11 or 11') and the mask layer 20, the DC bias voltage between the lower electrode and the upper electrode does not accelerate the ions of the plasma toward the sidewalls because of the direction of the DC electrical field is substantially parallel to the predominant direction of the velocity of the ions. Thus, the average kinetic energy of hydrofluorocarbon ions and hydrofluorocarbon polymers impinging on the top surface of the mask layer 20 and at the bottom surface of the trench (11 or 11') is greater than the average kinetic energy of hydrofluorocarbon ions and hydrofluorocarbon polymers impinging on the sidewalls of the trench (11 or 11') and the mask layer 20. Further, because the distance from the plasma is different between the top surface of the mask layer 20 and the bottom surface of the trench (11 or 11'), the deposition rates of the hydrofluorocarbon polymer material are different between the top surface of the mask layer 20 and the bottom surface of the trench (11 or 11').

In one embodiment, the deposition conditions during each deposition process in a repeated sequence of alternating deposition processes and etch processes can achieve the condition of superconfirmity or a condition close to superconformity as illustrated in the 1,000 Watts RF source power setting in FIG. 4. In this embodiment, the hydrofluorocarbon polymer layer 30 of FIGS. 1C, 1F, and 3 can include a first hydrofluorocarbon polymer portion 30A deposited at a first deposition rate on the bottom surface of a trench (11 or 11'), a second hydrofluorocarbon polymer portion 30B deposited at a second deposition rate on the sidewalls of the trench (11 or 11'), and a third hydrofluorocarbon polymer portion 30C deposited at a third deposition rate on a horizontal surface of the mask layer 20. The second deposition rate is at least 90% of the third deposition rate, and the first deposition rate is less than 50% of the third deposition rate. In some cases, the second deposition rate is greater than the third deposition rate. It is noted that the comparative exemplary deposition process illustrated in FIG. 5, which deposits a fluorocarbon polymer that does not include hydrogen, cannot simultaneous provide a deposition rate at a sidewall of a trench that is at least 90% of the deposition rate at the top surface of a mask layer without increasing the deposition rate at the bottom of a trench to a level grater then 50% of the deposition rate at the top surface of the mask layer. In one embodiment, the second deposition rate is greater than the third deposition rate in the structures of FIGS. 1C, 1F, and 3. Generally intramolecure hydrogen atom in fluorocarbon strengthen carbon-carbon bond which enable to reduce the probability of much dissociation of fluorocarbon in a plasma. Therefore hydrofluorocarbon $C_xH_yF_z$, wherein x is an integer not less than 3 as defined above can provide large size species such as C2 and/or C3 multiple carbon species more than C1 mono carbon species in a plasma. A large size species generally have higher sticking coefficient on semiconductor material than monocarbon species, therefore the hydrofluorocarbon $C_xH_yF_z$, wherein x is an integer not less than 3, and y and z are positive integers not greater than 15, can produce higher deposition rate on sidewall than on bottom.

FIGS. 6A-6C illustrate optical emission spectra of three comparative exemplary deposition processes that deposit a fluorocarbon polymer that does not include hydrogen for comparative purposes. FIGS. 6D-6F illustrate optical emission spectra for three deposition processes that deposit a hydrofluorocarbon polymer material according to embodiments of the present disclosure.

Specifically, FIG. 6A is an optical emission spectrum from the plasma generated in "Process 1," which employed $C_4F_8$ as a deposition gas and a plasma was generated at 25 mTorr employing 1,800 Watts of RF source power and 80 Watts of bias power at 20 degrees Celsius. FIG. 6B is an optical emission spectrum from the plasma generated in "Process 2," which employed $C_4F_8$ as a deposition gas and a plasma was generated at 25 mTorr employing 1,000 Watts of RF source power and 80 Watts of bias power at 20 degrees Celsius. FIG. 6C is an optical emission spectrum from the plasma generated in "Process 3," which employed $C_4F_8$ as a deposition gas and a plasma was generated at 25 mTorr employing 500 Watts of RF source power and 80 Watts of bias power at 20 degrees Celsius.

FIG. 6D is an optical emission spectrum from the plasma generated in "Process 4," which employed $C_5HF_7$ as a deposition gas and a plasma was generated at 25 mTorr employing 1,800 Watts of RF source power and 80 Watts of bias power at 20 degrees Celsius. FIG. 6E is an optical emission spectrum from the plasma generated in "Process 5," which employed $C_5HF_7$ as a deposition gas and a plasma was generated at 25 mTorr employing 1,000 Watts of RF source power and 80 Watts of bias power at 20 degrees Celsius. FIG. 6F is an optical emission spectrum from the plasma generated in "Process 6," which employed $C_5HF_7$ as a deposition gas and a plasma was generated at 25 mTorr employing 500 Watts of RF source power and 80 Watts of bias power at 20 degrees Celsius.

The horizontal axes of the spectra represent the wavelength of the emitted light from the plasma, and the vertical axes of the spectra represent the intensity of the emitted light in arbitrary units (a.u.). The locations of emission peaks corresponding to emission from $C_2$, $C_3$, and $CF_2$ species are marked with dotted lines, which are located at about 516 nm, about 412 nm, and about 263 nm. As used herein, "about" refers to a range of values within measurement error of instrumentation.

$C_4F_8$ plasmas under the condition of the RF source power in a range from 500 Watts to 1,800 Watts produce predominantly $CF_2$ or $CF_3$ species. $C_5HF_7$ gas under the condition of the RF source power in a range from 500 Watts to 1,800 Watts, and in general, a hydrofluorocarbon gas having a chemical formula of $C_xH_yF_z$, wherein x is an integer selected from 3, 4, 5, 6, and 7, y and z are positive integers not greater than 15, under a suitable RF source power has a drastically different dissociation pathway in the plasma, and hydrofluorocarbon species and more complex fluorocarbon species.

In one embodiment, a plasma of the hydrofluorocarbon gas can be generated at a condition that provides an optical emission spectrum including a $C_3$ peak at about 412 nm having a peak height that is twice as high as a peak height of a $CF_2$ peak at about 263 nm during each deposition step among the repeated alternating sequence of the etch steps and deposition steps as illustrated in FIGS. 6D and 6E.

In another embodiment, a plasma of the hydrofluorocarbon gas can be generated at a condition that provides an optical emission spectrum including a highest peak that is one of a $C_3$ peak at about 412 nm or a $C_2$ peak at about 516 nm during each deposition step among the repeated alternating sequence of the etch steps and deposition steps as illustrated in FIGS. 6D and 6E.

The repeated alternating sequence of the etch steps and deposition steps employing a hydrofluorocarbon gas having a chemical formula of $C_xH_yF_z$, wherein x is an integer selected from 3, 4, 5, 6, and 7, y and z are positive integers not greater than 15, can provide a net etch rate that is comparable with net etch rates of a comparative exemplary repeated alternating sequence of etch steps and deposition steps employing a fluorocarbon gas such as $C_4F_8$. At the same time, the repeated alternating sequence of the etch steps and deposition steps employing the hydrofluorocarbon gas can provide a lesser undercut dimension u (See FIG. 1G) than undercut dimensions provided by the comparative exemplary repeated alternating sequence.

Figure 7:
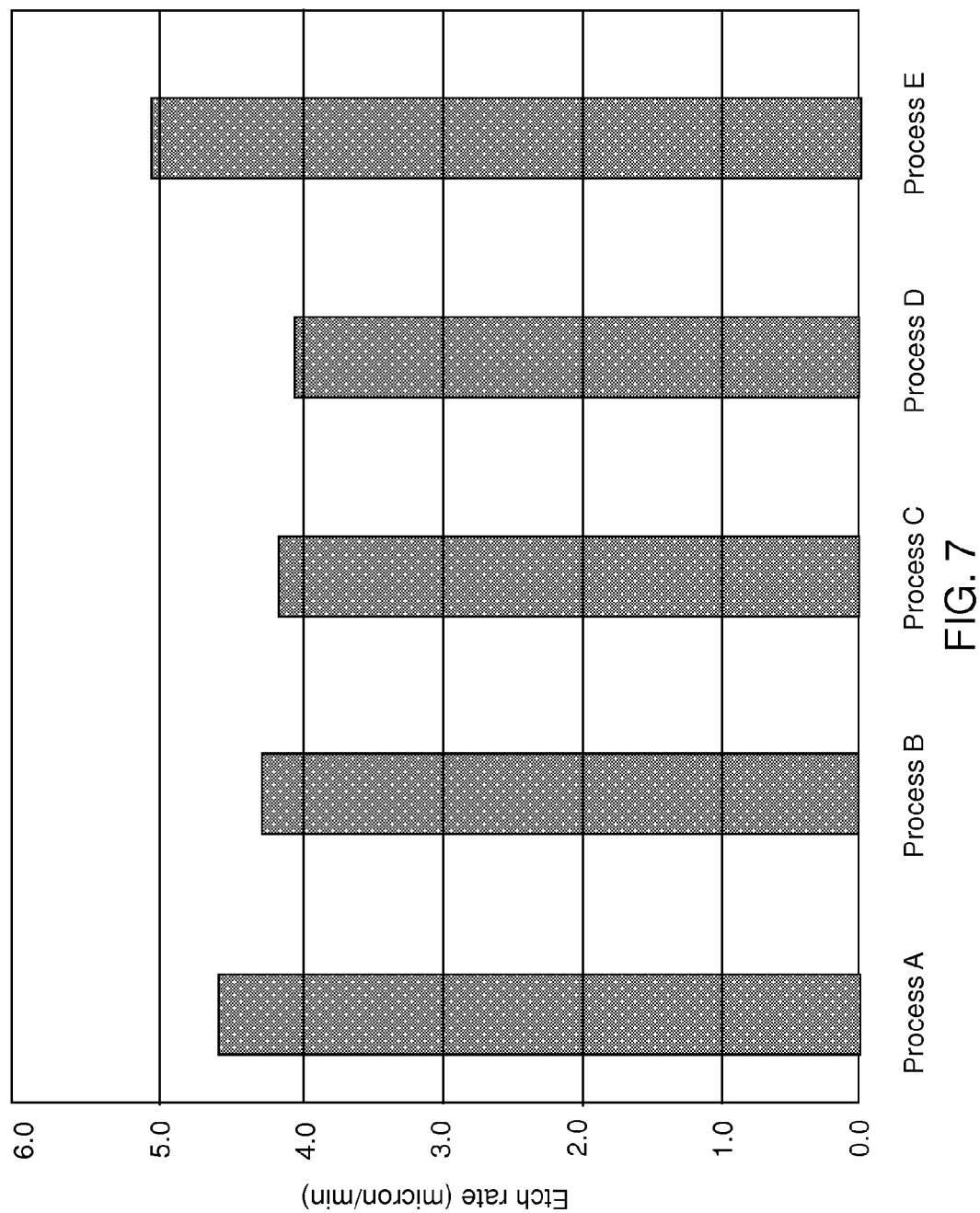
FIG. 7 is a graph comparing net etch rates of various comparative exemplary repetitive alternating sequences of etch processes and deposition processes, and repetitive alternating sequences of etch processes and deposition processes according to various embodiments of the present disclosure.
Figure 8:
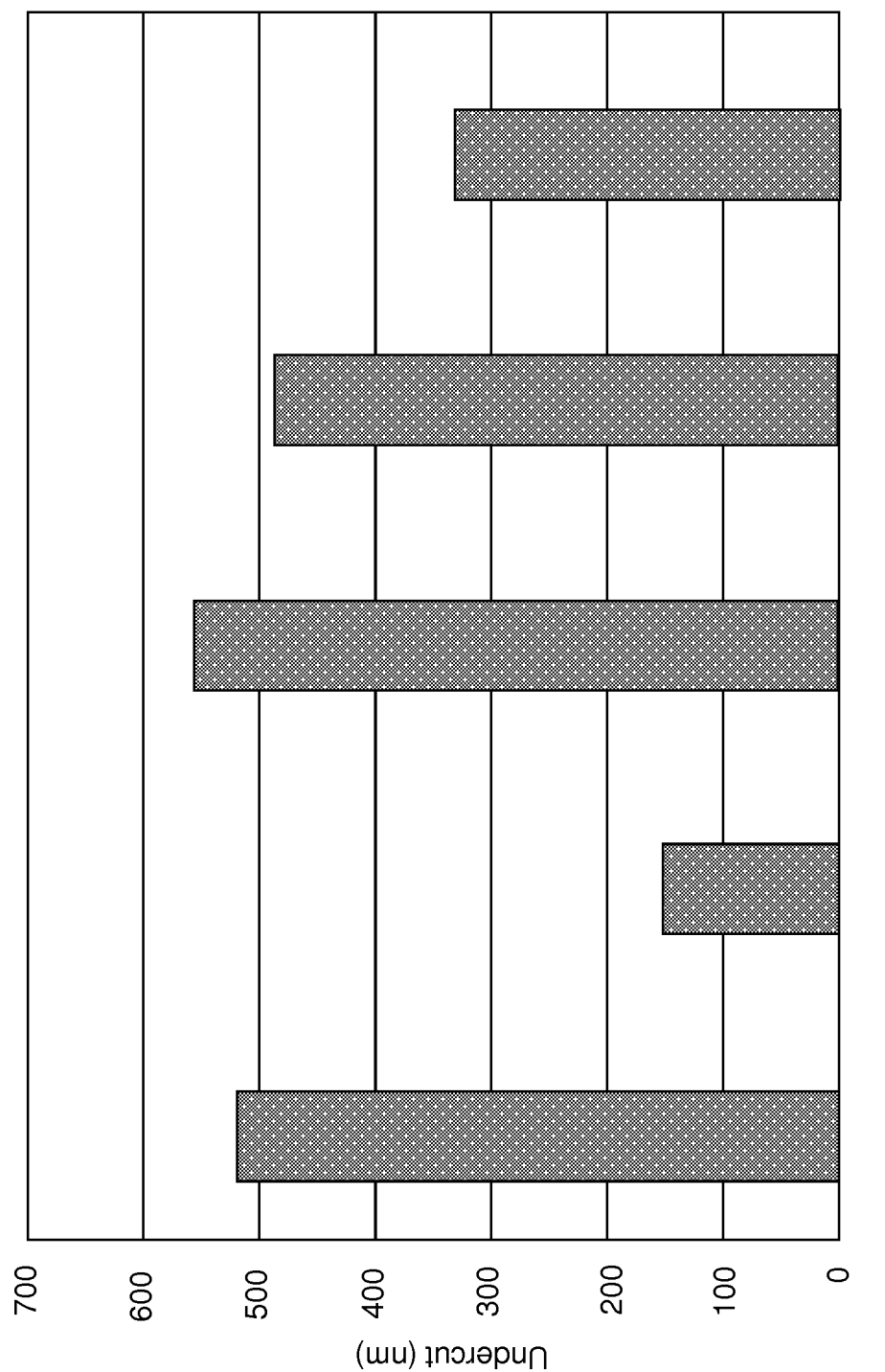
FIG. 8 is a graph comparing undercut dimensions of the various comparative exemplary repetitive alternating sequences of etch processes and deposition processes, and the repetitive alternating sequences of etch processes and deposition processes according to various embodiments of the present disclosure.

FIG. 7 is a graph comparing net etch rates of various comparative exemplary repetitive alternating sequences of etch processes and deposition processes, and repetitive alternating sequences of etch processes and deposition processes according to various embodiments of the present disclosure. FIG. 8 is a graph comparing the undercut dimension of the various comparative exemplary repetitive alternating sequences of etch processes and deposition processes, and the repetitive alternating sequences of etch processes and deposition processes according to various embodiments of the present disclosure.

Specifically, 3 micron wide lines were patterned in mask layers formed over a silicon substrate in each of the five samples employed to generate the data in FIGS. 7 and 8. "Process A" was performed on a first sample, "Process B" was performed on a second sample, "Process C" was performed on a third sample, "Process D" was performed on a fourth sample, and "Process E" was performed on the fifth sample. Process A employed a first comparative exemplary repetitive alternating sequences of etch processes and deposition processes in which $C_4F_8$ was employed as the deposition gas at a flow rate of 150 sccm, RF source power of 1,000 Watts and bias power of 80 Watts were applied to the plasma at a pressure of 25 mTorr, and the plasma was generated in a process chamber maintained at 20 degrees Celsius. Process B employed a second comparative exemplary repetitive alternating sequences of etch processes and deposition processes in which $C_4F_8$ was employed as the deposition gas at a flow rate of 150 sccm, RF source power of 1,000 Watts and bias power of 80 Watts were applied to the plasma at a pressure of 25 mTorr, and the plasma was generated in a process chamber maintained at −10 degrees Celsius.

Process C employed a first exemplary repetitive alternating sequences of etch processes and deposition processes in which $C_5HF_7$ was employed as the deposition gas at a flow rate of 150 sccm, RF source power of 1,800 Watts and bias power of 80 Watts were applied to the plasma at a pressure of 25 mTorr, and the plasma was generated in a process chamber maintained at 20 degrees Celsius. Process D employed a second exemplary repetitive alternating sequences of etch processes and deposition processes in which $C_5HF_7$ was employed as the deposition gas at a flow rate of 150 sccm, RF source power of 1,800 Watts and bias power of 80 Watts were applied to the plasma at a pressure of 25 mTorr, and the plasma was generated in a process chamber maintained at −10 degrees Celsius. Process E employed a third exemplary repetitive alternating sequences of etch processes and deposition processes in which $C_5HF_7$ was employed as the deposition gas at a flow rate of 150 sccm, RF source power of 1,000 Watts and bias power of 80 Watts were applied to the plasma at a pressure of 25 mTorr, and the plasma was generated in a process chamber maintained at 20 degrees Celsius. Sulfur hexafluoride was employed as the etchant gas across Processes A, B, C, D, and E.

Process A provided a net etch rate of about 4.6 microns per minute and an undercut dimension u (see FIG. 1G) of about 520 nm for a 3 micron wide line trench. Process A did not produce a micromasking phenomenon within the line trench, and provided minimal sidewall roughness and bottom roughness.

Process B provided a net etch rate of about 4.3 microns per minute and an undercut dimension u of about 150 nm for a 3 micron wide line trench. However, Process B produced a micromasking phenomenon in the line trench, thereby generating significant sidewall roughness and bottom roughness, and rendering the line trench unusable for formation of a through substrate via structure.

Process C provided a net etch rate of about 4.2 microns per minute and an under dimension u of about 550 nm for a 3 micron wide line trench. Process C did not produce a micromasking phenomenon within the line trench, and provided minimal sidewall roughness and bottom roughness.

Process D provided a net etch rate of about 4.1 microns per minute and an under dimension u of about 490 nm for a 3 micron wide line trench. Process D did not produce a micromasking phenomenon within the line trench, and provided minimal sidewall roughness and bottom roughness.

Process E provided a net etch rate of about 5.1 microns per minute and an under dimension u of about 325 nm for a 3 micron wide line trench. Process D did not produce a micromasking phenomenon within the line trench, and provided minimal sidewall roughness and bottom roughness.

Thus, processes of the present disclosure, such as Process E, can be employed to form a deep trench in a semiconductor substrate at a high net etch rate without micromasking and providing a small undercut dimension, which can be, for example, less than 350 nm for a 3 micron wide trench. For example, compared to Process A, Process E provide a greater etch rate and a reduce undercut by at least 30%.

Figure 9:
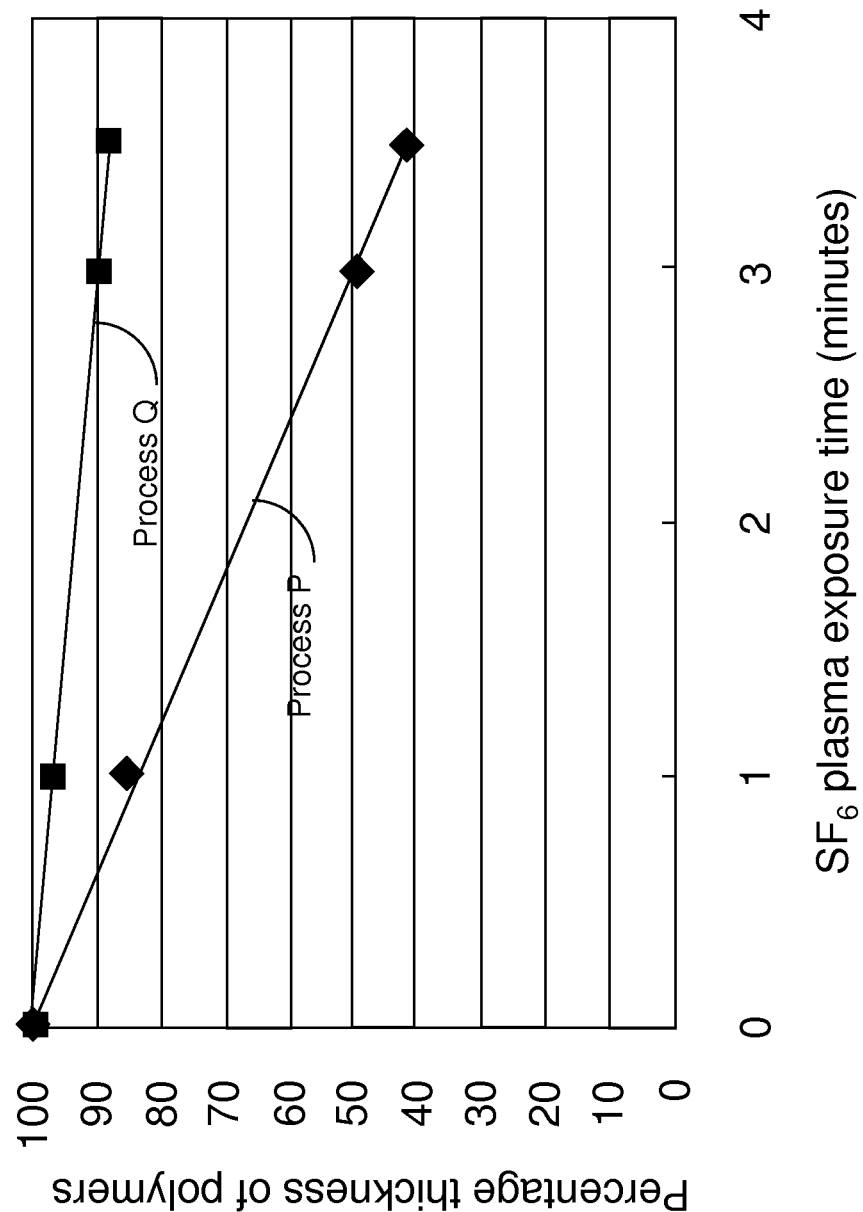
FIG. 9 is a graph illustrating resistance to fluorine exposure of a first comparative deposition process and a first exemplary deposition process according to an embodiment of the present disclosure.
Figure 10:
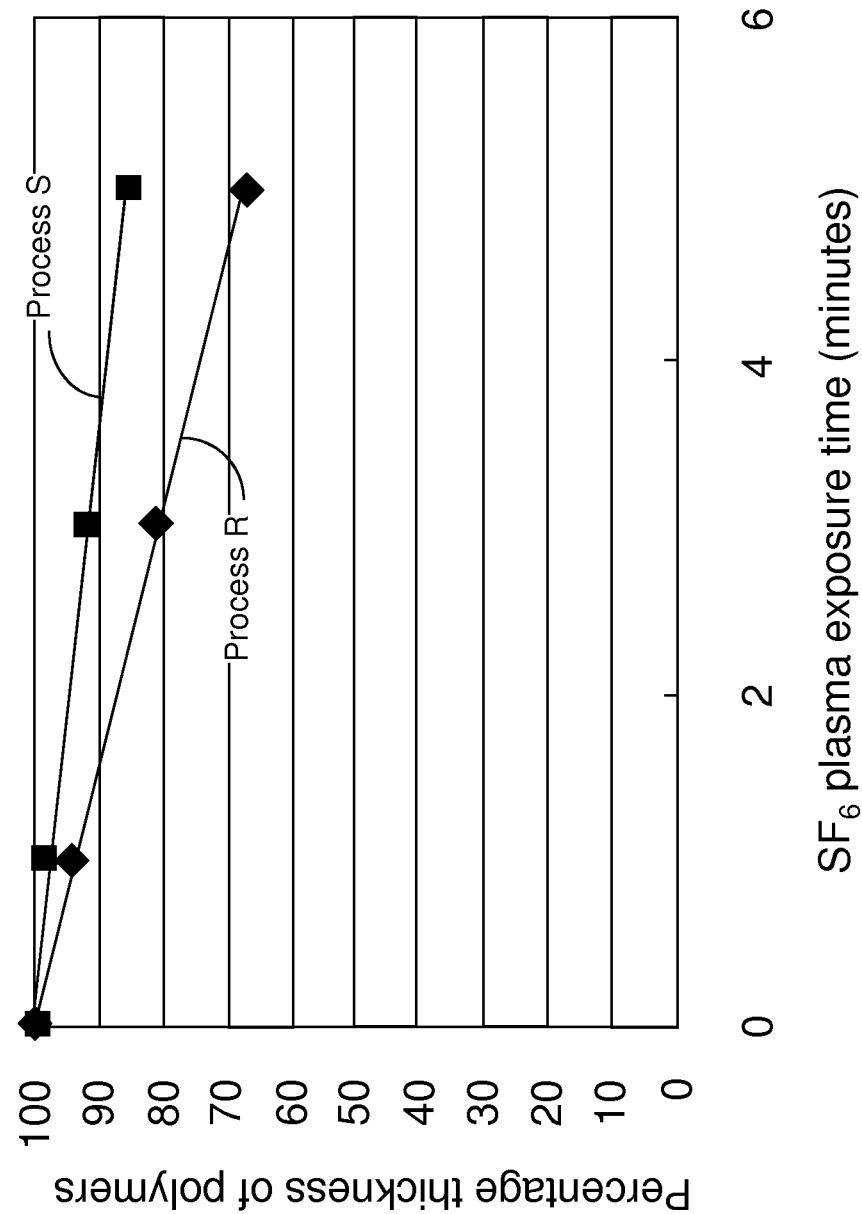
FIG. 10 is a graph illustrating resistance to fluorine exposure of a second comparative deposition process and a second exemplary deposition process according to an embodiment of the present disclosure.

The presence of hydrogen in the hydrofluorocarbon polymer material in the hydrofluorocarbon polymer layer 30 in FIGS. 1C, 1F, and 3 enhances resistance of the hydrofluorocarbon polymer material to a fluorine-containing etchant gas, such as sulfur hexafluoride, over fluorocarbon polymers that do not include hydrogen. FIGS. 9 and 10 compare etch resistance to exposure to sulfur hexafluoride plasma of hydrofluorocarbon polymers according to embodiments of the present disclosure with corresponding etch resistance of fluorocarbon polymers generated from comparative exemplary deposition processes.

Specifically, in Process P, a first sample was generated by depositing a fluorocarbon polymer layer from a $C_4F_8$ plasma on a planar substrate. The plasma was generated with 1,000 Watts of RF source power and 80 Watts of bias power, at a pressure of 25 mTorr and with 150 sccm of $C_4F_8$ flow, and at a temperature of 20 degrees Celsius. The thickness of the fluorocarbon polymer layer of the first sample was measured prior to exposure to a plasma of sulfur hexafluoride, and after various time durations of exposure to the plasma of sulfur hexafluoride that simulates an etch process for silicon. The initial thickness of the fluorocarbon polymer layer in the first sample was 387 nm. The properties of the fluorocarbon polymer material of the first sample represents the properties of the fluorocarbon polymer of Process A described above as formed on a top surface of a mask layer and a bottom surface of a trench in a structure having the same configuration as the exemplary test structure of FIG. 3 because polymers formed on horizontal surfaces of a substrate are subject to the full impact of the bias power applied to the plasma.

In Process P, a second sample was generated by depositing a hydrofluorocarbon polymer layer from a $C_5HF_7$ plasma on a planar substrate according to an embodiment of the present disclosure. The plasma was generated with 1,000 Watts of RF source power and 80 Watts of bias power, at a pressure of 25 mTorr and with 150 sccm of $C_5HF_7$ flow, and at a temperature of 20 degrees Celsius. The thickness of the hydrofluorocarbon polymer layer in the second sample was measured prior to exposure to a plasma of sulfur hexafluoride, and after various time durations of exposure to the plasma of sulfur hexafluoride that simulates an etch process for silicon. The initial thickness of the hydrofluorocarbon polymer layer in the second sample was 549 nm. The properties of the hydrofluorocarbon polymer material of the second sample represents the properties of the hydroluorocarbon polymer of Process E described above as formed on the top surface of a mask layer 20 and the bottom surface of the trench (11 or 11') in the exemplary structure of FIGS. 1C and 1F and in the exemplary test structure of FIG. 3 because polymers formed on horizontal surfaces of a substrate are subject to the full impact of the bias power applied to the plasma.

In Process R, a third sample was generated by depositing a fluorocarbon polymer layer from a $C_4F_8$ plasma on a planar substrate. The plasma was generated with 1,000 Watts of RF source power and without any bias power, at a pressure of 25 mTorr and with 150 sccm of $C_4F_8$ flow, and at a temperature of 20 degrees Celsius. The thickness of the fluorocarbon layer in the third sample was measured prior to exposure to a plasma of sulfur hexafluoride, and after various time durations of exposure to the plasma of sulfur hexafluoride that simulates an etch process for silicon. The initial thickness of the fluorocarbon polymer layer in the third sample was 674 nm. The properties of the fluorocarbon polymer material of the third sample represents the properties of the fluorocarbon polymer of Process A described above as formed on sidewalls of a mask layer and sidewalls of a trench in a structure having the same configuration as the exemplary test structure of FIG. 3 because polymers formed on vertical surfaces of a substrate are not significantly affected by the bias power applied to the plasma.

In Process S, a fourth sample was generated by depositing a hydrofluorocarbon polymer layer from a $C_5HF_7$ plasma on a planar substrate according to an embodiment of the present disclosure. The plasma was generated with 1,000 Watts of RF source power and without any bias power, at a pressure of 25 mTorr and with 150 sccm of $C_5HF_7$ flow, and at a temperature of 20 degrees Celsius. The thickness of the hydrofluorocarbon polymer layer of the fourth sample was measured prior to exposure to a plasma of sulfur hexafluoride, and after various time durations of exposure to the plasma of sulfur hexafluoride that simulates an etch process for silicon. The initial thickness of the hydrofluorocarbon polymer layer in the fourth sample was 520 nm. The properties of the hydrofluorocarbon polymer material of the fourth sample represents the properties of the hydrofluorocarbon polymer of Process E described above as formed on the sidewalls of the mask layer 20 and the sidewalls of the trench (11 or 11') in the exemplary structure of FIGS. 1C and 1F and in the exemplary test structure of FIG. 3 because polymers formed on vertical surfaces of a substrate are not significantly affected by the bias power applied to the plasma.

The thicknesses of remaining polymers as a percentage of the initial thickness are plotted in FIGS. 9 and 10 for Processes P, Q, R, and S. Comparison of the various curves of FIGS. 9 and 10 show that the hydrofluorocarbon polymers derived from a $C_5HF_7$ plasma is more etch resistant than fluorocarbon polymers derived from a $C_4F_8$ plasma under same conditions. Thus, presence of hydrogen in the hydrofluorocarbon polymer material provides more protection to the sidewalls of the trench during etching, and contributes to the superior performance of Process E relative to Process A as illustrated in FIGS. 7 and 8.

Further, FIGS. 9 and 10 clearly illustrate that there is a compositional difference between the hydrofluorocarbon polymer material deposited on the top surface of the mask layer 20 and the bottom surface of the trench (11 or 11') in the exemplary structure of FIGS. 1C and 1F and the exemplary test structure of FIG. 3 relative to the hydrofluorocarbon polymer material deposited on the sidewalls of the mask layer 20 and the sidewalls of the trench (11 or 11') in the exemplary structure of FIGS. 1C and 1F and the exemplary test structure of FIG. 3. Specifically, Process S shows more etch resistance to sulfur hexafluoride etch than Process Q. Thus, the hydrofluorocarbon polymer material deposited on the sidewalls of the mask layer 20 and the sidewalls of the trench (11 or 11') in the exemplary structure of FIGS. 1C and 1F and the exemplary test structure of FIG. 3 is more etch resistant than the hydrofluorocarbon polymer material deposited on the top surface of the mask layer 20 and the bottom surface of the trench (11 or 11') in the exemplary structure of FIGS. 1C and 1F and the exemplary test structure of FIG. 3.

Referring back to FIGS. 1A-1L and 3, the composition of various portions of a hydrofluorocarbon polymer layer 30 at the end of each deposition step, which is included among the repetitive processing sequence between the processing step of FIG. 1B and the processing step of FIG. 1G, is the same as the composition of the corresponding portions of the hydrofluorocarbon polymer layer 30 within the exemplary test structure of FIG. 3. By selecting a deposition process such as Process E for the deposition steps of the repetitive processing sequence of FIGS. 1B-1G, the various portions of the hydrofluorocarbon polymer layer 30 can have different compositions.

For example, the first hydrofluorocarbon polymer portion 30A deposited on the bottom surface of the trench 11 in the structures of FIG. 1F and any intermediate structure before the processing step of FIG. 1G immediate after a deposition step can have the same composition as the hydrofluorocarbon polymer material in the second sample prior to exposure to $SF_6$. The second hydrofluorocarbon polymer portion 30B deposited on the sidewalls of the trench 11 and the mask layer 20 in the structures of FIG. 1F and any intermediate structure before the processing step of FIG. 1G immediate after a deposition step can have the same composition as the hydrofluorocarbon polymer material in the fourth sample prior to exposure to $SF_6$. In addition, the third hydrofluorocarbon polymer portion 30C deposited on the top surface of the mask layer 20 in the structures of FIG. 1F and any intermediate structure before the processing step of FIG. 1G immediate after a deposition step can have the same composition as the hydrofluorocarbon polymer material in the second sample prior to exposure to $SF_6$.

In addition, the first hydrofluorocarbon polymer portion 30A deposited on the bottom surface of the trench 11 in the structures of FIG. 1F and any intermediate structure before the processing step of FIG. 1G immediate after a deposition step can have the same etch resistance to a fluorine-containing etchant gas as the second sample (which is characterized by the curve labeled "Process Q"). The second hydrofluorocarbon polymer portion 30B deposited on the sidewalls of the trench 11 and the mask layer 20 in the structures of FIG. 1F and any intermediate structure before the processing step of FIG. 1G immediate after a deposition step can have the same etch resistance to a fluorine-containing etchant gas as the fourth sample (which is characterized by the curve labeled "Process S"). In addition, the third hydrofluorocarbon polymer portion 30C deposited on the top surface of the mask layer 20 in the structures of FIG. 1F and any intermediate structure before the processing step of FIG. 1G immediate after a deposition step can have the same etch resistance to a fluorine-containing etchant gas as the second sample (which is characterized by the curve labeled "Process Q").

Thus, the first composition of the first hydrofluorocarbon polymer portion 30A in the hydrofluorocarbon polymer layer 30 of FIGS. 1C, 1F, and 3 can be the same as the composition of the hydrofluorocarbon polymer material in the second sample, the second composition of the second hydrofluorocarbon polymer portion 30B in the hydrofluorocarbon polymer layer of FIGS. 1C, 1F, and 3 can be the same as the composition of the hydrofluorocarbon polymer material in the fourth sample, and the third composition of the third hydrofluorocarbon polymer portion 30C in the hydrofluorocarbon polymer layer 30 of FIGS. 1C, 1F, and 3 can be the same as the composition of the hydrofluorocarbon polymer material in the second sample. The first composition is different from the second composition. The second composition can be more etch resistant to an etchant gas employed during the etch process than the first composition. The etch process of the repetitive alternating sequence can etch a first portion of the hydrofluorocarbon polymer located at the bottom surface of a trench (11, 11'), i.e., the first hydrofluorocarbon polymer portion 30A, at a faster rate than a second portion of the hydrofluorocarbon polymer located at the sidewalls of the trench (11, 11'), i.e., the second hydrofluorocarbon polymer portion 30B.

Figure 11:
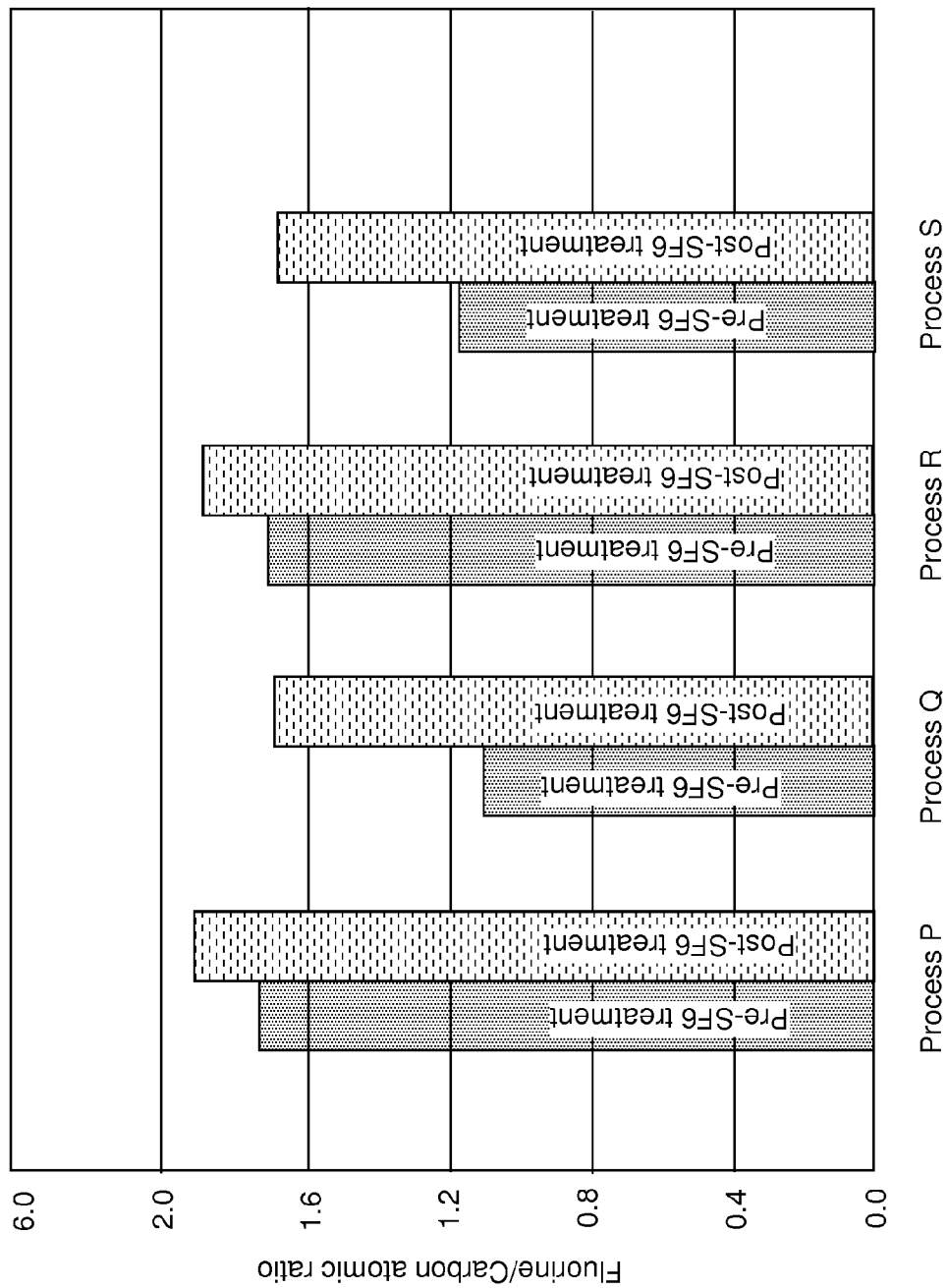
FIG. 11 is a graph illustrating the composition of various polymer deposits before, and after, treatment with $SF_6$ plasma as analyzed by X-ray photoemission spectroscopy according to the first and second comparative processes and the first and second exemplary deposition processes according to embodiments of the present disclosure.

Referring to FIG. 11, X-ray photoemission spectroscopy was employed to measure the atomic ratio of fluorine to carbon on the first, second, third, and fourth samples before, and after exposure to sulfur hexafluoride plasma at 25 mTorr for several times up to and including 5 minutes at 1800 Watts. As discussed above, the first sample was subjected to Process P, which is a first comparative process. The second sample was subjected to Process Q, which includes a first exemplary deposition process according to the present disclosure. The third sample was subjected to Process R, which is a second comparative process. The fourth sample was subjected to Process S, which includes a second exemplary deposition process according to the present disclosure.

While the atomic ratio of fluorine to carbon changes by less than 0.2 for the first sample and the third sample that include fluorocarbon polymers (that do not include hydrogen), the atomic ratio of fluorine to carbon changed by about 0.5~0.6 for the third sample and the fourth sample that include hydrofluorocarbon polymers. Fluorine atoms replace hydrogen atoms during the treatment with the sulfur hexafluoride plasma. Thus, when an etch process is performed during the repetitive alternating sequences of the etch processes and deposition processes of FIGS. 1B-1G, a plasma of a fluorine-containing etchant can cause substitution of a significant fraction of hydrogen atoms in the hydrofluorocarbon polymer material with fluorine atoms before the hydrofluorocarbon polymer material becomes rich in fluorine, and eventually removed from the sidewalls of the trench 11 and the mask layer 20.

The change in the fluorine to carbon atomic ratio represents a minimum in the hydrogen content in the hydrofluorocarbon polymer material. Significant differences have been observed in the hydrogen composition in the hydrofluorocarbon polymer materials generated by the methods of the present disclosure. In general, the hydrofluorocarbon polymer material in the hydrofluorocarbon polymer layer 30 of FIGS. 1C, 1F, and 3 can includes carbon at an atomic concentration in a range from 20% to 50%, hydrogen at an atomic concentration from 4% to 70%, and fluorine at an atomic concentration from 4% to 70%.

In one embodiment, the first composition of the first hydrofluorocarbon polymer portion 30A in the hydrofluorocarbon polymer layer 30 of FIGS. 1C, 1F, and 3 includes hydrogen at a first hydrogen atomic percentage, and the second composition of the second hydrofluorocarbon polymer portion 30B in the hydrofluorocarbon polymer layer 30 of FIGS. 1C, 1F, and 3 includes hydrogen at a second hydrogen atomic percentage that is greater than the first hydrogen atomic percentage. In one embodiment, the second hydrogen atomic percentage is greater than the first hydrogen atomic percentage by at least 5%. In another embodiment, the second hydrogen atomic percentage is greater than the first hydrogen atomic percentage by at least 10%. In yet another embodiment, the second hydrogen atomic percentage is greater than the first hydrogen atomic percentage by at least 15%.

Further, in one embodiment, the ratio of fluorine to hydrogen can be less than 15 within the hydrofluorocarbon polymer as illustrated in FIG. 11. (See Pre-$SF_6$ treatment data for Process Q and Process S.)

Figure 12:
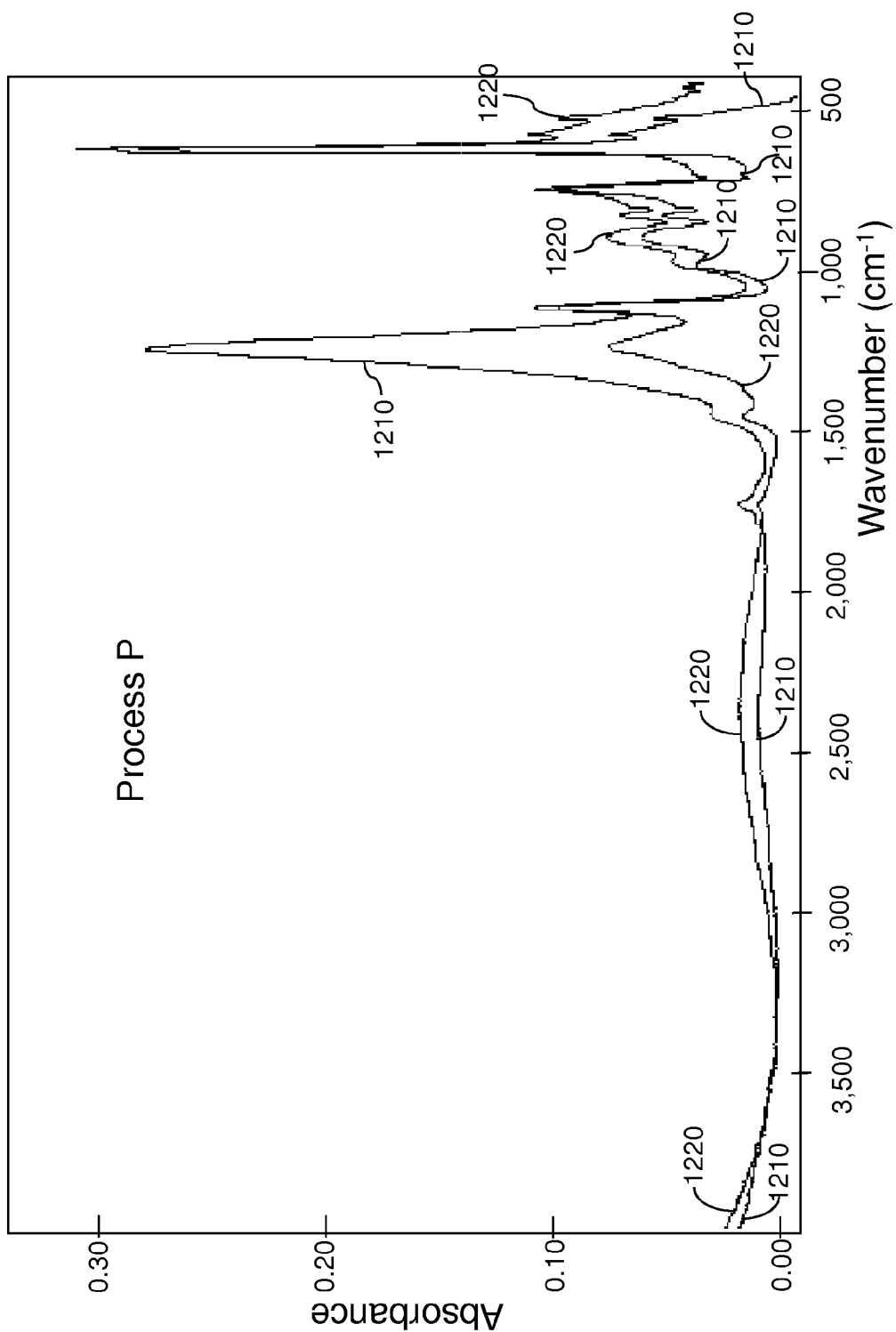
FIG. 12 shows Fourier-transformation infrared spectroscopy spectra from a polymer deposit generated by the first comparative exemplary deposition process before, and after, treatment with $SF_6$ plasma.
Figure 13:
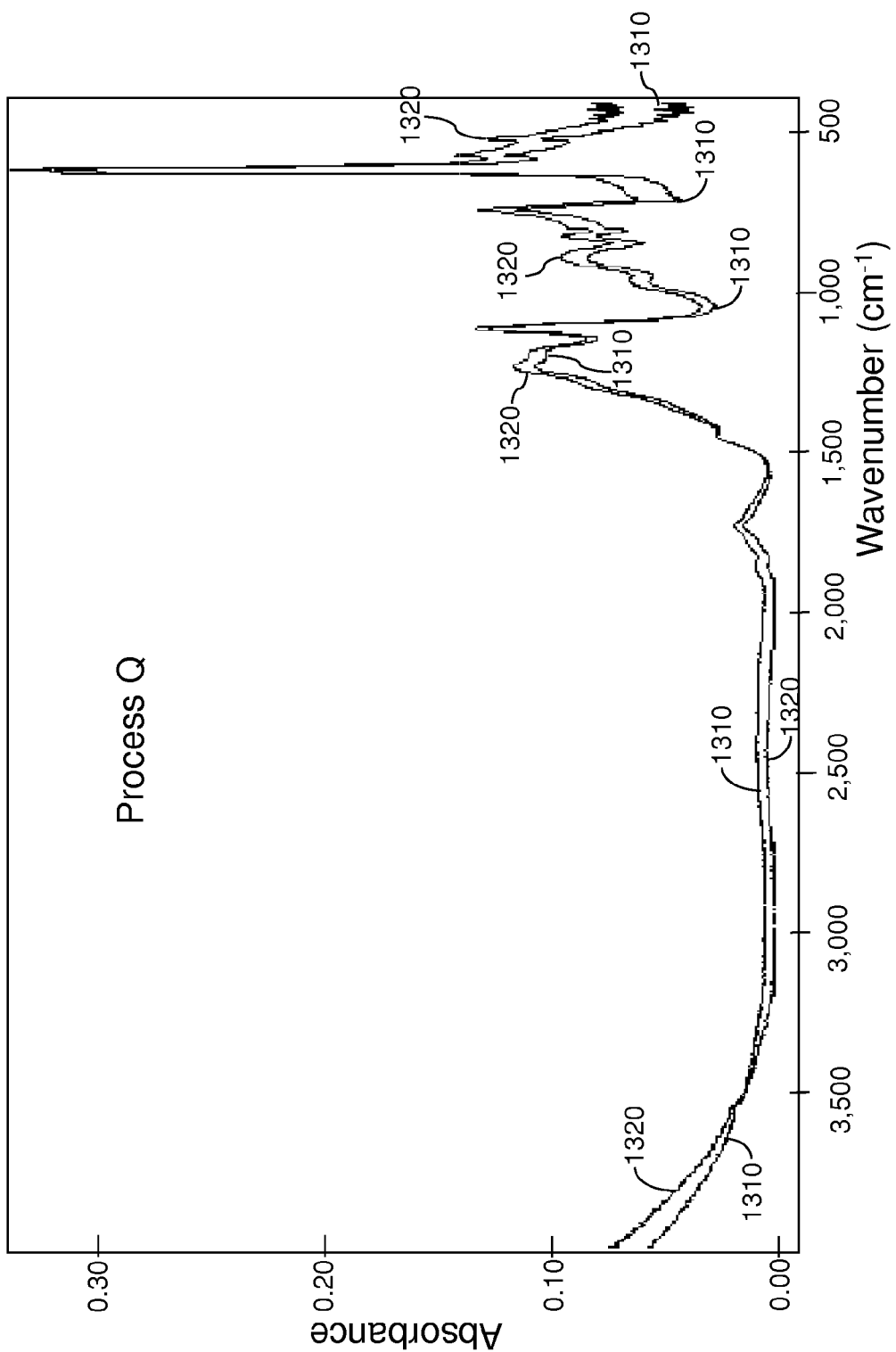
FIG. 13 shows Fourier-transformation infrared spectroscopy spectra from a polymer deposit generated by the first exemplary deposition process before, and after, treatment with $SF_6$ plasma according to an embodiment of the present disclosure.
Figure 14:
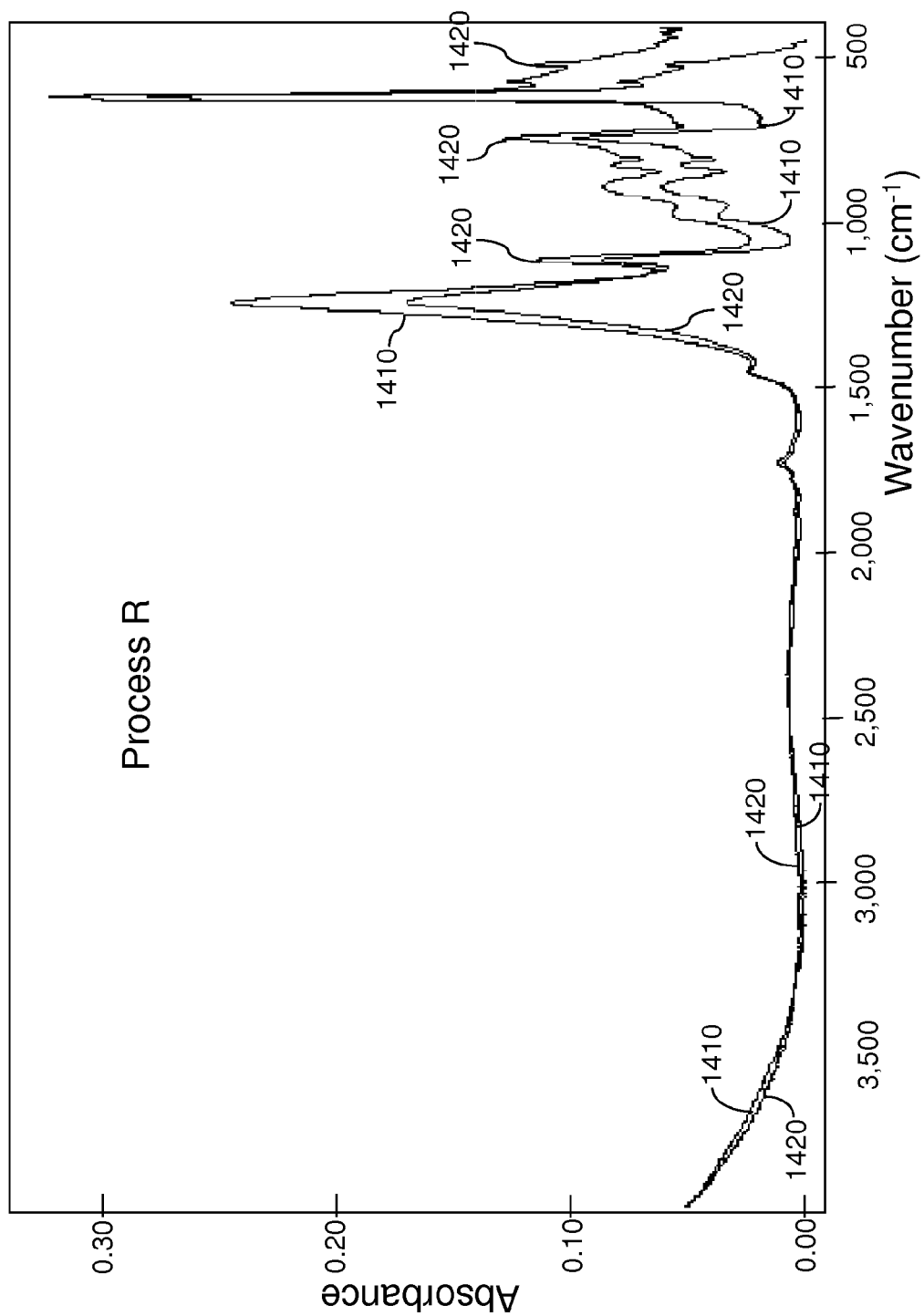
FIG. 14 shows Fourier-transformation infrared spectroscopy spectra from a polymer deposit generated by the second comparative exemplary deposition process before, and after, treatment with $SF_6$ plasma.
Figure 15:
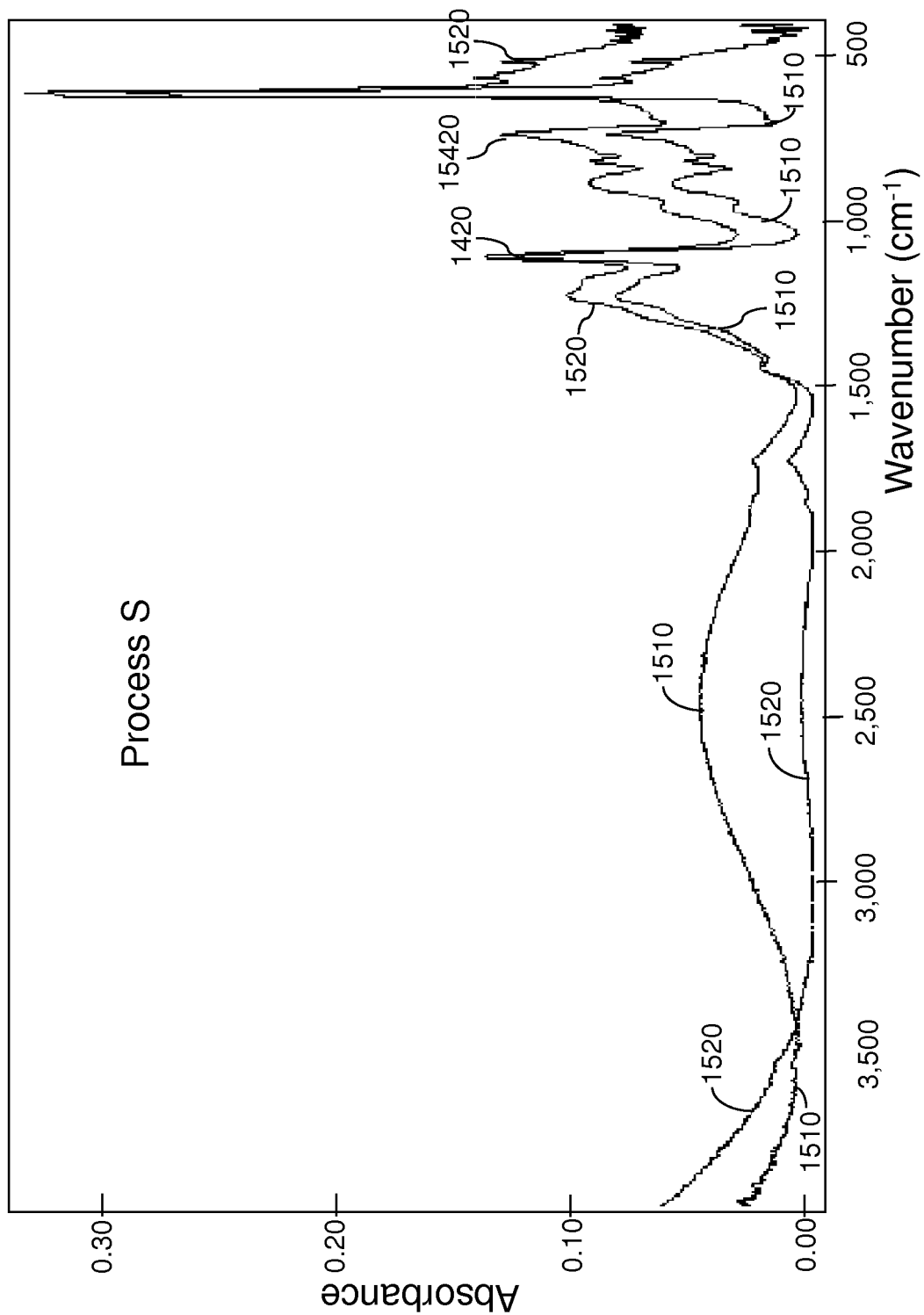
FIG. 15 shows Fourier-transformation infrared spectroscopy spectra from a polymer deposit generated by the second exemplary deposition process before, and after, treatment with $SF_6$ plasma according to an embodiment of the present disclosure.

Referring to FIGS. 12, 13, 14, and 15, Fourier-transformation infrared (FTIR) spectroscopy spectra are shown from the hydrofluorocarbon polymer deposits in the first, second, third, and fourth samples, respectively, as measured before, and after, treatment with $SF_6$ plasma. FIG. 12 shows a pre-treatment FTIR spectrum 1210 and a post-treatment FTIR spectrum 1220 for the first sample that is subjected to Process P described above. FIG. 13 shows a pre-treatment FTIR spectrum 1310 and a post-treatment FTIR spectrum 1320 for the second sample that is subjected to Process Q described above. FIG. 14 shows a pre-treatment FTIR spectrum 1410 and a post-treatment FTIR spectrum 1420 for the third sample that is subjected to Process R described above. FIG. 15 shows a pre-treatment FTIR spectrum 1510 and a post-treatment FTIR spectrum 1520 for the fourth sample that is subjected to Process S described above.

Significant amounts of C—H bonds, represented by a broad peak in the wavenumber range between $2000^{-1}$ to $3000$ cm$^{-1}$ in the pre-treatment FTIR spectrum 1510, is observed for the fourth sample. The broad peak disappears after the SF$_6$ treatment as illustrated in the post-treatment FTIR spectrum 1520. However, a corresponding peak is not discernable in the pre-treatment FTIR spectrum 1310 or the post-treatment FTIR spectrum 1320 of the second sample. Typical fluorocarbon absorbance peaks such as a peak at $1240$ cm$^{-1}$, caused by CF, CF$_2$, and CF$_3$, decrease after the SF$_6$ treatment in the second sample and in the fourth sample.

Figure 16:
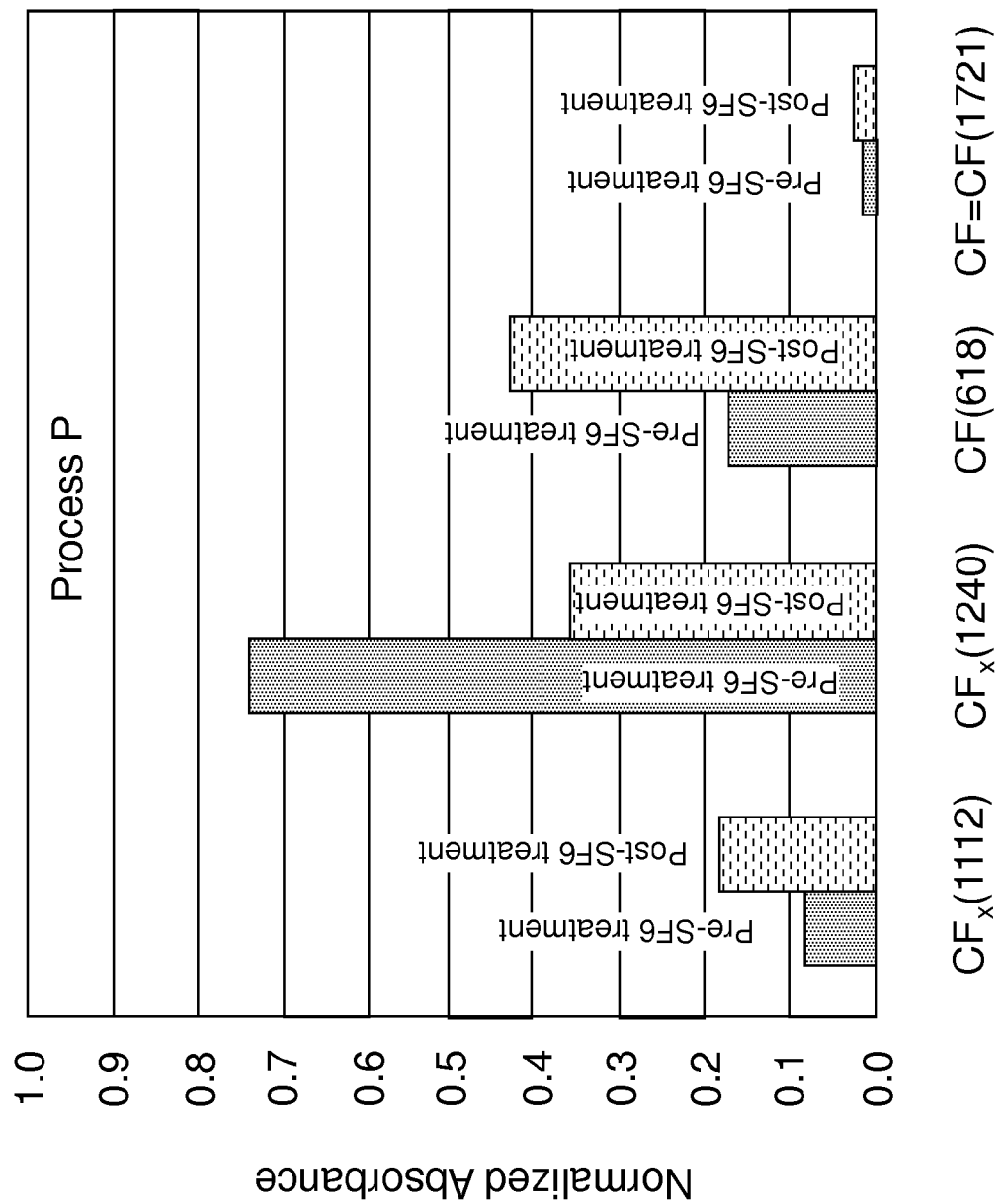
FIG. 16 is a graph showing normalized absorbance of the polymer deposit generated by the first comparative exemplary deposition process before, and after, treatment with $SF_6$ plasma.
Figure 17:
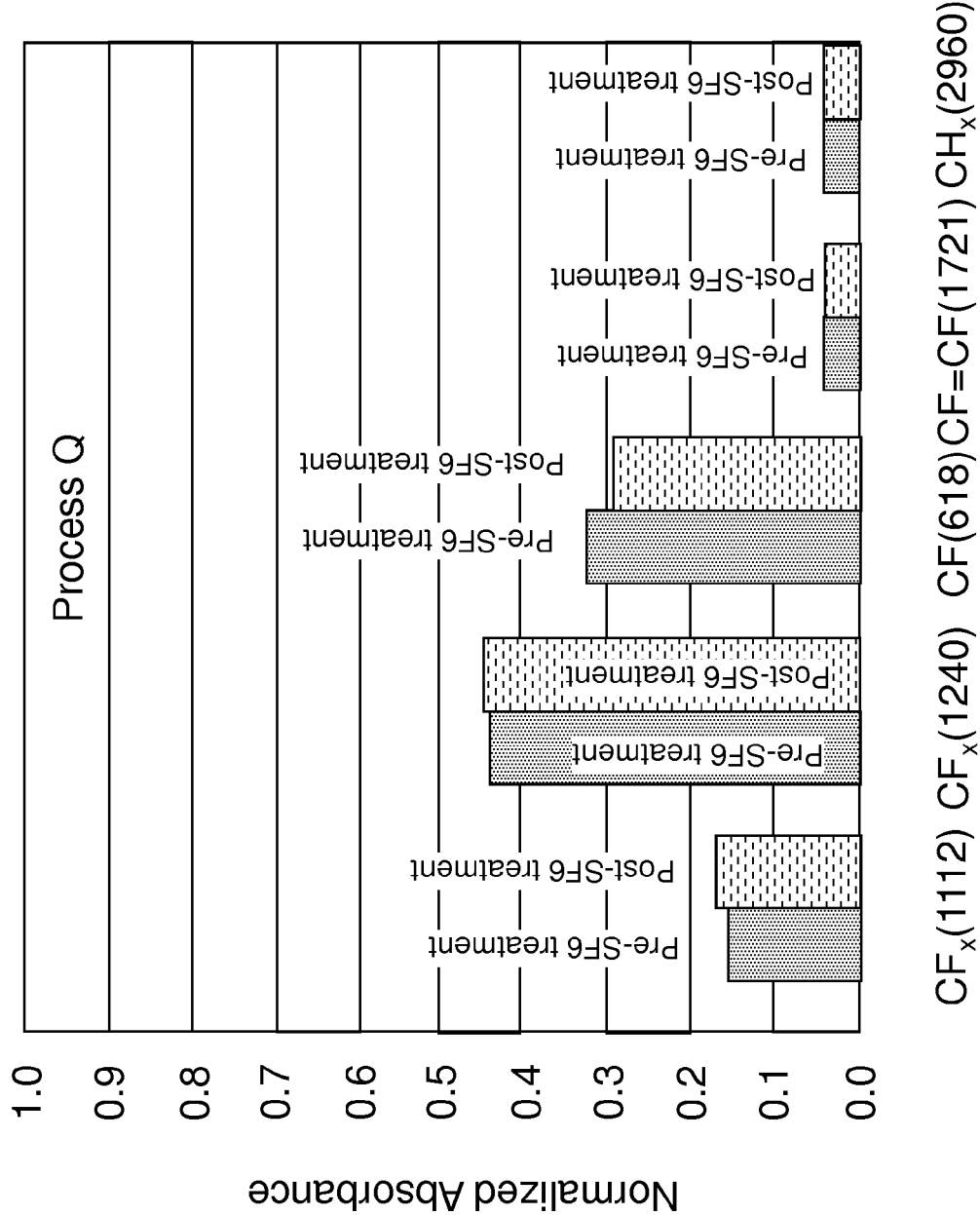
FIG. 17 is a graph showing normalized absorbance of the polymer deposit generated by the first exemplary deposition process before, and after, treatment with $SF_6$ plasma according to an embodiment of the present disclosure.
Figure 18:
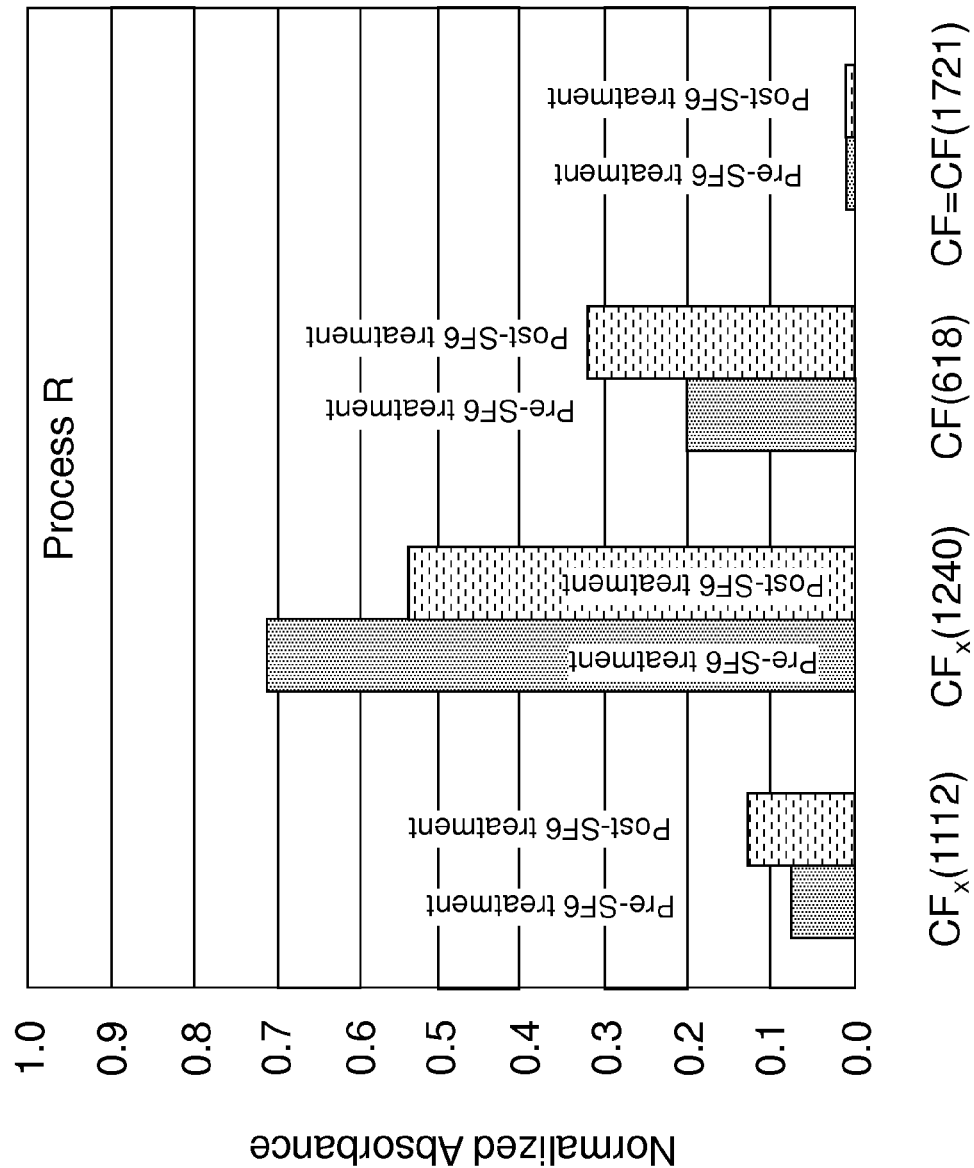
FIG. 18 is a graph showing normalized absorbance of the polymer deposit generated by the second comparative exemplary deposition process before, and after, treatment with $SF_6$ plasma.
Figure 19:
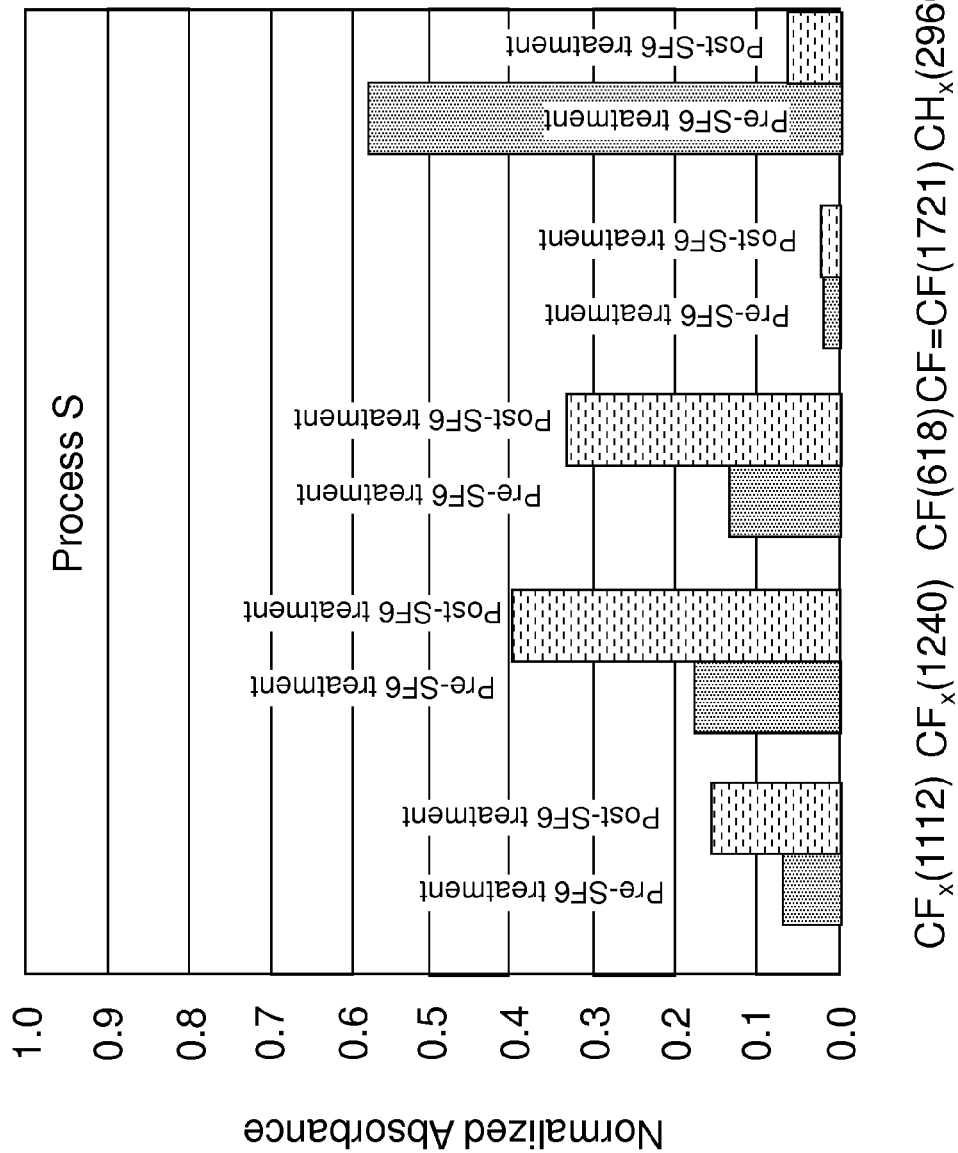
FIG. 19 is a graph showing normalized absorbance of the polymer deposit generated by the second exemplary deposition process before, and after, treatment with $SF_6$ plasma according to an embodiment of the present disclosure.

Referring to FIGS. 16, 17, 18, and 19, normalized absorbance of the hydrofluorocarbon polymer deposits in the first, second, third, and fourth sample, respectively, are shown before, and after, treatment with SF$_6$ plasma for various peaks representing various chemical bonds. FIGS. 16 and 18 show normalized absorbance of the peaks at $1112$ cm$^{-1}$, $1240$ cm$^{-1}$, $618$ cm$^{-1}$, and $1721$ cm$^{-1}$. FIGS. 17 and 19 show normalized absorbance of the peaks at $1112$ cm$^{-1}$, $1240$ cm$^{-1}$, $618$ cm$^{-1}$, $1721$ cm$^{-1}$, and $2960$ cm$^{-1}$. The peak at $2960$ cm$^{-1}$ corresponds to CH$_x$ bonds (in which x is a positive integer) in the hydrofluorocarbon polymer material in the second and fourth samples. While the height of the peak at $2960$ cm$^{-1}$ is at about 0.05 in the second sample before and after the treatment with SF$_6$ (See FIG. 17), the height of the peak at $2960$ cm$^{-1}$ is about 0.57 in the fourth sample before the treatment with SF$_6$ (See FIG. 19). This peak in the fourth sample decreases to about 0.07 after the treatment with SF$_6$, which represents replacement of CH$_x$ bonds with CF$_x$ bonds.

The difference in the height of the peak at $2960$ cm$^{-1}$ between the second sample and the fourth sample prior to the treatment with SF$_6$ corresponds to the differences between the atomic concentration of hydrogen in the first composition and the atomic concentration of hydrogen in the second composition, i.e., the composition of the first hydrofluorocarbon polymer portion 30A and the composition of the second hydrofluorocarbon polymer portion 30B in FIGS. 1C, 1F, and 3. The high concentration of hydrogen atoms in the second hydrofluorocarbon polymer portion 30B is caused by a higher rate of hydrogen incorporation when the hydrofluorocarbon polymer is deposited with little ion energy, i.e., without significant energy gained by the bias voltage applied across the lower electrode and the upper electrode in the process chamber. The hydrogen rich film in the hydrofluorocarbon polymer portion 30B is reduced and incorporates fluorine upon exposure to SF$_6$, which changes film density and becoming less resistant to the SF$_6$ plasma.

Thus, a deposition process that employs a hydrofluorocarbon gas having a chemical formula of C$_x$H$_y$F$_z$, wherein x is an integer selected from 3, 4, 5, 6, and 7, y and z are positive integers not greater than 15 can be employed in a repetitive alternating sequence of etch processes and deposition processes to provide a deep trench in a semiconductor substrate such that the net etch rate is enhanced and undercut is reduced compared to comparative exemplary repetitive alternating sequence of etch processes and deposition processes employing a fluorocarbon gas that does not include hydrogen as the deposition gas.

While the present disclosure has been described employing a deep trench as a feature, the methods of the present disclosure can be employed to form a structure including any feature that is etched within in a substrate such as a shallow trench, a contact trench, a circular or annular via or contact feature, or any other trench having a recessed surface relative to a top surface. Such variations are expressly contemplated herein. Further, as used herein, a "trench" refers to any type of cavity having a surface that is recessed into a substrate relative to another surface of the substrate.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a semiconductor structure comprising:
    providing a stack of a semiconductor substrate and a mask layer having an opening therein, wherein a top surface of said semiconductor substrate is physically exposed at a bottom of said opening; and
    repeatedly performing a sequence of an etch process and a deposition process on said stack, wherein said etch process removes a semiconductor material at a bottom surface of a trench underlying said opening, and said deposition process deposits a hydrofluorocarbon polymer material on said bottom surface and sidewalls of said trench that is generated from a plasma containing radicals and ions of a hydrofluorocarbon gas, wherein said hydrofluorocarbon polymer material has a first composition at said bottom surface of said trench, said hydrofluorocarbon polymer material has a second composition at said sidewalls of said trench, wherein said second composition is different from said first composition.

2. The method of claim 1, wherein said hydrofluorocarbon gas includes a gas having a chemical formula of C$_x$H$_y$F$_z$, wherein x is an integer selected from 3, 4, 5, 6, and 7, y and z are positive integers not greater than 15.

3. The method of claim 1, wherein said hydrofluorocarbon polymer material includes carbon at an atomic concentration in a range from 20% to 50%, hydrogen at an atomic concentration from 4% to 70%, and fluorine at an atomic concentration from 4% to 70%.

4. The method of claim 1, wherein a ratio of fluorine to hydrogen is less than 15 within said hydrofluorocarbon polymer material.

5. The method of claim 1, wherein said first composition includes hydrogen at a first hydrogen atomic percentage, and said second composition includes hydrogen at a second hydrogen atomic percentage that is greater than said first hydrogen atomic percentage.

6. The method of claim 5, wherein said second hydrogen atomic percentage is greater than said first hydrogen atomic percentage by at least 5%.

7. The method of claim 1, wherein said second composition is more etch resistant to an etchant gas employed during said etch process than said first composition.

8. The method of claim 1, wherein said etch process employs a plasma of a fluorine-containing etchant and substitutes a fraction of hydrogen atoms in said hydrofluorocarbon polymer material with fluorine atoms.

9. The method of claim 1, wherein said etch process etches a first portion of said hydrofluorocarbon polymer material located at said bottom surface at a faster rate than a second portion of said hydrofluorocarbon polymer material located at said sidewalls of said trench.

10. The method of claim 1, wherein said hydrofluorocarbon polymer material includes a first hydrofluorocarbon polymer portion deposited at a first deposition rate on said bottom surface, a second hydrofluorocarbon polymer portion deposited at a second deposition rate on said sidewalls of said trench, and a third hydrofluorocarbon polymer portion deposited at a third deposition rate on a horizontal surface of said mask layer, wherein said second deposition rate is at least 90% of said third deposition rate, and said first deposition rate is less than 50% of said third deposition rate.

11. The method of claim 10, wherein said second deposition rate is greater than said third deposition rate.

12. The method of claim 1, wherein said mask layer includes a dielectric material selected from doped silicon oxide, undoped silicon oxide, silicon nitride, silicon oxynitride, a dielectric metal oxide, or a combination thereof.

13. The method of claim 1, wherein said repeated performance of said sequence forms modulations in width within said trench as a function of depth.

14. The method of claim 1, further comprising:
filling said trench with a conductive material portion; and
planarizing a bottom portion of said semiconductor substrate, wherein a surface of said conductive material portion is physically exposed after said planarizing.

15. The method of claim 1, wherein said semiconductor material is silicon.

16. A method of forming a semiconductor structure comprising:
providing a stack of a semiconductor substrate and a mask layer having an opening therein, wherein a top surface of said semiconductor substrate is physically exposed at a bottom of said opening; and
repeatedly performing a sequence of an etch process and a deposition process on said stack, wherein said etch process removes a semiconductor material at a bottom surface of a trench underlying said opening, and said deposition process deposits a hydrofluorocarbon polymer material on said bottom surface and sidewalls of said trench that is generated from a plasma containing radicals and ions of $C_5HF_7$.

17. The method of claim 16, wherein said hydrofluorocarbon polymer material has a first composition at said bottom surface of said trench, said hydrofluorocarbon polymer material has a second composition at said sidewalls of said trench, wherein said second composition is different from said first composition.

18. A method of forming a semiconductor structure comprising:
providing a stack of a semiconductor substrate and a mask layer having an opening therein, wherein a top surface of said semiconductor substrate is physically exposed at a bottom of said opening;
repeatedly performing a sequence of an etch process and a deposition process on said stack, wherein said etch process removes a semiconductor material at a bottom surface of a trench underlying said opening, and said deposition process deposits a hydrofluorocarbon polymer material on said bottom surface and sidewalls of said trench that is generated from a plasma containing radicals and ions of a hydrofluorocarbon gas; and
generating, during said deposition process, a plasma of said hydrofluorocarbon gas at a condition that provides an optical emission spectrum including a $C_3$ peak at about 412 nm having a peak height that is twice as high as a peak height of a $CF_2$ peak at about 263 nm.

19. The method of claim 18, wherein said hydrofluorocarbon polymer material has a first composition at said bottom surface of said trench, said hydrofluorocarbon polymer material has a second composition at said sidewalls of said trench, wherein said second composition is different from said first composition.

20. The method of claim 19, wherein said first composition includes hydrogen at a first hydrogen atomic percentage, and said second composition includes hydrogen at a second hydrogen atomic percentage that is greater than said first hydrogen atomic percentage.

21. The method of claim 19, wherein said second composition is more etch resistant to an etchant gas employed during said etch process than said first composition.

22. A method of forming a semiconductor structure comprising:
providing a stack of a semiconductor substrate and a mask layer having an opening therein, wherein a top surface of said semiconductor substrate is physically exposed at a bottom of said opening;
repeatedly performing a sequence of an etch process and a deposition process on said stack, wherein said etch process removes a semiconductor material at a bottom surface of a trench underlying said opening, and said deposition process deposits a hydrofluorocarbon polymer material on said bottom surface and sidewalls of said trench that is generated from a plasma containing radicals and ions of a hydrofluorocarbon gas; and
generating, during said deposition process, a plasma of said hydrofluorocarbon gas at a condition that provides an optical emission spectrum including a highest peak that is one of a $C_3$ peak at about 412 nm or a $C_2$ peak at about 516 nm.

23. The method of claim 22, wherein said hydrofluorocarbon polymer material has a first composition at said bottom surface of said trench, said hydrofluorocarbon polymer material has a second composition at said sidewalls of said trench, wherein said second composition is different from said first composition.

24. The method of claim 23, wherein said first composition includes hydrogen at a first hydrogen atomic percentage, and said second composition includes hydrogen at a second hydrogen atomic percentage that is greater than said first hydrogen atomic percentage.

25. The method of claim 23, wherein said second composition is more etch resistant to an etchant gas employed during said etch process than said first composition.

\* \* \* \* \*